(12) United States Patent
Takai

(10) Patent No.: US 6,373,307 B1
(45) Date of Patent: Apr. 16, 2002

(54) SEMICONDUCTOR INTEGRATED CIRCUIT

(75) Inventor: Yasuhiro Takai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/588,724

(22) Filed: Jun. 7, 2000

(30) Foreign Application Priority Data

Jun. 18, 1999 (JP) .......................................... 11-173376

(51) Int. Cl.[7] .............................................. H03L 7/00
(52) U.S. Cl. ...................................... 327/161; 327/141
(58) Field of Search ................................ 327/156, 146, 327/105, 141, 161

(56) References Cited

U.S. PATENT DOCUMENTS 5,602,884 A * 2/1997 Wieczorkiewicz et al. .. 327/156

FOREIGN PATENT DOCUMENTS

JP            10303713 A  * 11/1998

* cited by examiner

Primary Examiner—Dinh T. Le
(74) Attorney, Agent, or Firm—McGinn & Gibb, PLLC

(57) ABSTRACT

A semiconductor integrated circuit is provided, whose circuit can be formed easily, is capable of stable operation even when temperature fluctuates, and capable of being measured and set after the semiconductor integrated circuits are produced. The semiconductor integrated circuit comprises a first delay circuit string (112), in which propagation times for propagating in a forward path and a backward path are set to the same times, a time for switching the propagation path from the forward path to the backward path is controlled by the first control signal (101), for making an edge signal propagate reciprocatively when said first delay control signal is input; a second delay circuit string (212), in which a ratio of the propagation time in the forward path to the propagation time in the backward path is set to a predetermined value, the edge signal is made to propagate in the forward path when said second delay control signal (203) is input, and a timing to switch propagation path of the edge signal from the forward path to the backward path is controlled by an output signal (104) output after reciprocatively propagating in said first delay circuit string; and pulse generating circuits (113) and (213) for generating a pulse signal from signals output from said first and second delay circuit strings (112) and (212).

22 Claims, 18 Drawing Sheets

FIG. 8 PRIOR ART
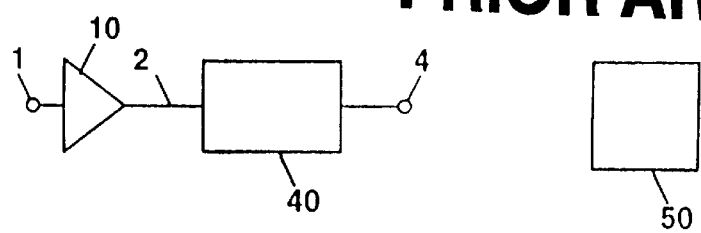
FIG. 9 PRIOR ART
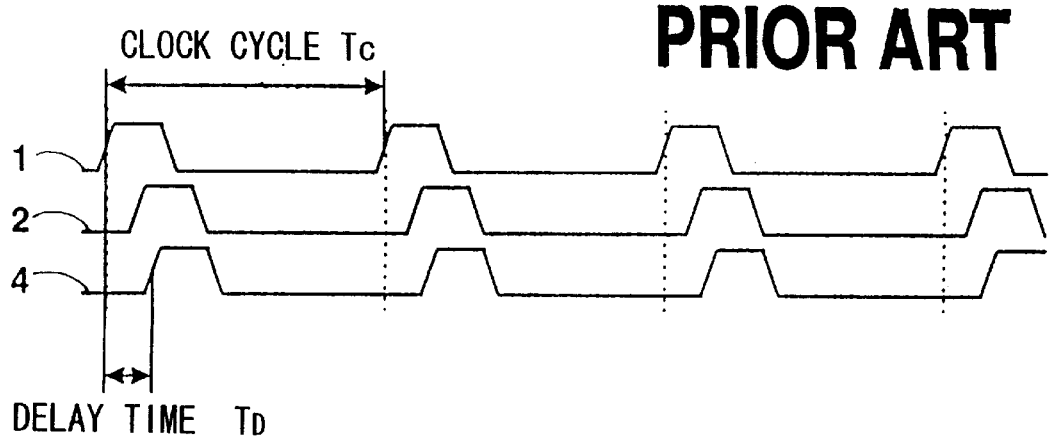

SEMICONDUCTOR INTEGRATED CIRCUIT

BACKGROUND OF THE INVENTION

1. Field of the Invention

The present invention relates to a semiconductor integrated circuit, and particularly relates to a semiconductor integrated circuit having a delay circuit used for generating a synchronization signal (hereinafter, called a clock signal).

2. Background Art

Conventionally, in the semiconductor integrated circuit operated in synchronism with a clock signal, the external clock signal 1 is received by a signal receiving circuit 10 and is amplified by an amplification circuit 40 for generating an internal clock signal 4 to be used for a circuit 50 for controlling the clock signal. FIG. 8 is a block diagram showing the schematic structure of a conventional semiconductor integrated circuit.

As shown in FIG. 9, a delay time $T_D$ is generated between the external clock signal 1 and the internal signal 4 in the course of being received by the receiving circuit 10 and amplified by the amplification circuit 40. FIG. 9 is a diagram showing a timing chart of a clock used in the conventional semiconductor integrated circuit.

The delay time tends to increase because the scale of the circuit required for the semiconductor integrated circuit increases as the manufacturing technology advances. At the same time, as the operational speed of the system installed with such an integrated circuit increases, the operational speed of a clock cycle in which the semiconductor integrated circuit operates also increases. As a result, the delay time $T_D$ occupies a relatively large portion in the clock cycle $T_C$, which results in hindering the operation of the circuit.

An example of one of the conventional measures for reducing the increase of the delay time $T_D$ in the clock cycle $T_C$ is to use a phase locked loop (hereinafter, called PLL).

As the operational speed of computers increases, the data transfer speed of the semiconductor memory device becomes a speed limiting factor of the system performance. In order to improve the data transfer speed of the semiconductor memory devices, an operational specification is proposed, which is termed the double data rate, for executing an input and output operation twice within one clock cycle. FIG. 10 shows a timing chart when the double data rate is executed. In the double data rate operation, an order signal and an address signal are input at a rise of the clock signal, and the data input and output signals are input and output at an intermediate timing between the rise and fall of the clock signal.

That is, in the double data rate operation, the order signal Com and the address signal Add are input at the rise of the clock signal CLK, and the data input and output signal is carried out by inputting a data DQ at an intermediate timing between the rise and fall of the clock signal. It is advantageous to adopt such a specification regarding the double data rate operation, since, when the frequency of the clock is 66 MHz, it is possible to obtain a data transfer speed of 132 Mbits/sec, corresponding to twice the transfer frequency of 66 MHz, while the clock frequency of the operational frequency of the data signal is maintained at the same transmission speed of 66 MHz, the same as that of the operational frequency of the clock signal. Thus, such a double data rate operation is now being adopted in future high speed DRAMs such as a high speed SRAM, a synchronous DRAM, and a sink link DRAM (Nikkei Microdevice February issue, p. 11, 1997). The double data rate specification is generally wide spread in the wide fields of technology not only for use in the semiconductor devices but also being adopted for the APG specification defined for high speed data transfer 15 between a graphics controller LSI and a system controller LSI ("Accelerated Graphics port Interface Specification" Revision, 1.0, Intel Corporation, Jul., 31, 1996).

Here, the reason for not adopting the rise and fall of the clock signal as the standard in the double data rate specification is because the cycle time of the operation of the semiconductor integrated circuit becomes unstable as the clock cycle time decreases. As the clock cycle time decreases, the transition time of the clock signal ceases to be negligibly small, and the waveform consisting of the rise and the fall of the waves becomes asymmetric, which results in causing unequal cycle times because the period at high voltage and the period at low voltage in regard to the input threshold voltage becomes unequal.

Conventionally, the PLL integrated with a dividing circuit has been used for realizing the double data rate specification. The PLL is operated so as to generate an internal clock signal and to making the phase difference between the internal clock signal and the external clock signal into zero. However, the problem arises that the power consumption of the PLL increases, since it takes more than ten cycles and, accordingly, since it is necessary to operate the PLL continuously in order to use an internal clock signal having no phase difference with the external clock signal at a desired timing. The increasing power consumption causes a larger problem in the semiconductor memory devices, particularly in the case of a plurality of dynamic RAMs, used as the main memory components in a computer system. Furthermore, another problem arises in that the accuracy of the control frequency is lowered, since the oscillating operation is controlled by the voltage since the voltage control oscillator 62 is controlled by the voltage.

A few methods for solving the above problems have been proposed, such as RDLL (Register-Controlled Delay-Locked Loop) or SMD (Synchronous Mirror Delay). The details of these methods are described in IEICE Trans. Electron. Vol 1, No. 6, pp. 798–807, and in Japanese Patent Application, First publication No. 8-237091. A method to provide the double data rate specification using these techniques has also been proposed.

The double data rate specification can be provided by use of these RDLL and SMD. Since the times required for removing the phase difference between the internal clock signal and the external clock signal in the RDLL and the SMD are one cycle and two cycles, respectively, it is not necessary to operate the circuit continuously. Thus, since it is possible to stop the operation of the circuit when the internal clock signal 4 is not used, and since the power is not necessary while the circuit is on standby, the power consumption can be reduced. In addition, the RDDLL and the SMD are not provided with the voltage control oscillator for controlling the oscillation so that the control frequency can be maintained accurately irrespective of the power source voltage.

However, the RDLL and the SMD still have a problem in that these circuits cannot afford sufficient operational freedom for the time window getting narrower due to the dispersion of the generation timing of the internal clock signal by the dispersion of the cycle time.

To sum up, in the semiconductor integrated circuit, timings of the input and output signals are prescribed by the clock input signal. That is, when the data input signal DQ is latched by the clock input signal CLK, as shown in FIG. 10A, the time for preserving the data input signal before and after the clock input signal, that is, the input setting time $t_S$ and the input holding time $t_{h1}$, are provided.

As shown in FIG. 10B, when outputting the data, an access time $t_a$, the time until the data output signal is fixed, and an output holding time $t_{h2}$, the time for holding the previous data output signal, are decided. The resolution of the RDLL is determined by one delay circuit, corresponding to the two gate levels, which is the minimum unit that can be set by the shift register. The resolution of the SMD circuit is the two gate levels.

Accordingly, the timing of the internal clock signal with respect to the external clock varies within the resolution, that is, within a range of time propagating the two gate levels. Rules of the input/output timings of the input setup time $t_S$, the input holding time $t_{h1}$, the access time $t_a$, and the output holding time $t_{h2}$ are determined by the external clock signal as the standard, so that, if the timing of the internal clock signal alters with respect to that of the external clock signal, the operational freedom for the rule are reduced.

The input and output timings disperse due to parasitic capacitance and inductance among external data input and output signals and the manufacturing conditions. Thus, the dispersion of the internal clock signals reduces the timing freedom, restricts freedom in the manufacturing conditions, and finally inhibits the high speed operation. In addition, the RDLL and the SMD comprises the delay circuit string constituted by alternately connecting the NAND elements and inverters in series. Thus, particularly regarding a NAND element comprising P-type MOSFETs connected in parallel and N-type MOSFETs connected in series, unequal transition times are generated in the P-type MOSFETs and the N-type MOSFETs, such unequal transition times are accumulated by propagation of the pulse signal in the delay circuit string, and the waveform of the pulse signal deforms, which causes a problem in the worse case that the pulse signal disappears.

The inventors of the present application have filed an invention which has solved the above problems as Japanese Patent Application, First Publication No. Hei 9-152656, which will be described hereinafter.

FIG. 11 is a diagram showing the schematic structure of the above invention which has solved the problems associated with the RDLL and SMD circuits. FIGS. 12 to 14 are timing charts showing the operations of the conventional semiconductor integrated circuit.

Referring to FIG. 11, the semiconductor integrated circuit is constituted by two sets of delay circuit strings 120 and 220 which comprise a receiving circuit 10, a polarity control circuit 20, two sets of control circuits 110 and 210, delay circuits 1010, 1030, 1050, 1090, 1110, and 1990; two sets of pulse generating circuits 130 and 230; and an amplification circuit 40.

The above receiving circuit 10 receives the external clock signal 1 and outputs an internal signal 2 transformed into an internal power source potential. The polarity control circuit 20 comprising a flip-flop 21 and two inverters 22 and 23 receives the internal signal 2 and outputs the polarity control signal 3 which alternately reverses the logic level by an input of the clock signal. The control circuit 110 comprises a flip-flop 111, a delay circuit 112, and an AND circuit 113. The first control signal 101 and the second control signal 102 are mutually reversed phase signals which toggle at a rise of the external clock signal 1 by receiving the polarity control signal 3. The input signal 103 of the delay circuit string 120 rises only when the rise of the control signal 101 through a delay time of the delay circuits 112.

The flip flop 21 forming the polarity control circuit 20 receives a clock signal input which is a inverted signal of the internal signal 2 by the inverter 23, in order to prevent malfunction due to skew shift between the input of the flip flop 111 in the control circuit 110.

The delay circuit 1090 constituting the delay circuits line 120 comprises two sets of two serially connected P-type MOSFETs 1081 and 1082, and 1091 and 1092; and two sets of two serially connected N-type MOSFETs 1083 and 1084, and 1093 and 1094; and a first, second, third and fourth nodes An−1, Bn−1, An, and Bn that are used for the input and output nodes.

Gates of transistors 1081 and 1084, whose sources are connected to the power supply source and the ground line, are connected to the first control signal 102. The drain of the N-type MOSFET 1083, whose gate is connected to the first nodes An−1, is connected to the second node Bn−1. The drain of the P-type MOSFET 1092, whose gate is connected to the second node, is connected to the third nodes An. The drain of the N-type MOSFET 1093, whose gate is connected to the fourth node, is connected to the third node An. The drain of the P-type MOSFET 1082, whose gate is connected with the third node, is connected to the second node Bn−1.

The operation is as follows. In the first period wherein the potential of the first control signal 101 is high, if the potential of the first node An−1 becomes high, the high potential of both gates of the two serially connected N-type MOSFETs 1083 and 1084 converts these N-type MOSFETs become a conductive state, and the potential of the second node Bn−1 is changed to low. Since the potential of the second control signal 102 is low, if the second node point is converted to low, the low potential of both gates of two serially connected P-type MOSFETs converts these P-type MOSFETs to conductive, and the potential of the third node point An is changed into high.

In the second period wherein the potential of the first control signal 101 is low, since the potential of the second control signal 102 is high, when the potential of the fourth node point Bn becomes high, the high potential of the gates of the two serially connected N-type MOSFETs 1093 and 1094 converts these N-type MOSFETs to a conductive state for changing the potential of the third node An to low. When the potential of the third node becomes low, since the high potentials of the gates of two serially connected P-type MOSFETs convert both P-type MOSFETs to a conductive state, and the potential of the second node point Bn−1 becomes high.

Next, operations of the control circuit 110, the delay circuit string 120, and the pulse generating circuit 13 are explained with reference to FIG. 13. FIG. 13 is a timing chart for explaining the operations of the control circuit 110, the delay circuit string 120, and the pulse generating circuit 13.

When the clock signal 2 rises at the time 5 ns, the first signal 101 is converted into a high voltage and the second signal 102 is converted into a low voltage (the first period). When the input signal 103 of the delay circuit string 120, that is, the node A0 becomes high voltage through the delay circuit 112, the node B0 is discharged and subsequently the node A1 is charged.

Subsequently, while the nodes Ak (k=0, 1, 2, . . . ) are being charged and the nodes Bk are being discharged, the edge signal advances towards the right direction of FIG. 11. The right direction of FIG. 11 means that the value k increases, and the left direction is the direction in which the value k decreases. For example, the node Ak is located on the right side of the node Ak−1 which is located on the left side of the node Ak.

At the time 15 ns, the next clock signal 2 rises, and when the potential of the first signal is inverted to the low potential and the second signal is inverted to the high potential, the edge signal propagates to the node B8, and the node B8 is in the process of discharging. At this time, since the P-type MOSFET for charging the node A9 is blocked by the high potential of the first control signal 102 connected to the gate of the P-type MOSFET, the node A9 is not charged.

The node A8 in the process of discharging is charged due to continuity of the P-type MOSFET for charging the node B8, since the potential of the first control signal becomes low while the potential of the node remains low. Subsequently, in the second period, while the node Ak is discharged, the node Bk is charged, the edge signal moves toward the right direction of the circuit diagram of FIG. 11, and the potential of the node B0, that is, the output signal 104 of the delay circuit string 120 becomes high. The pulse generating circuit 130 comprising a delay circuit 131, an inverter 132, and an AND circuit 133 detects the rise of an input signal 104 and outputs one shot pulse signal once for every two cycles only in the second period.

The operational waveforms of the conventional circuit as a whole are described with reference to FIG. 12. FIG. 12 is a timing chart for explaining the operations of the conventional circuit as a whole.

The constitutions of a control circuit 210, a delay circuit string 220, and a pulse generating circuit 230 are the same as those of the control circuit 110, the delay circuit string 120, and the pulse generating circuit 130, and they are operated in mutually reversed phases to each other by inputting the polarity control signal 3 after inversion by the inverter 30. For example, as shown in FIG. 12, the first control signal 101 output from the control circuit 110 and the second control signal 201 output from the control circuit 210 have mutually reversed phases to each other.

As a result of the logical add operation of the output signals 105 and 205 from the pulse generating circuit s 130 and 230, the internal clock signal 4 is generated for each cycle.

Next, the delay time is described with reference to FIG. 12. In the first period and in the second period, a signal propagates along the same path in the reverse direction. Since the parasitic capacities of respective nodes constituting the delay circuit string are respectively equal and since the capacities of the P-type MOSFETs and the N-type MOSFETs constituting the delay circuit string are respectively equal, the propagation time from the fall of the node B0 to the fall of the node B8 in the first period is equal to the propagation time from the rise of the node B8 to the rise of the node B0 in the second period. That is, the propagation time propagating in the delay circuit string 120 in the first period is equal to the propagation time propagating in the delay circuit string 120 in the second period.

The time until the delay circuit control signal is output from the control circuit 110 after the external clock signal 1 is input into the receiving circuit 10, that is, the propagation time of the external clock signal 1 in the receiving circuit 10 and the control circuit 110, is set to t1. The time until the internal clock signal 4 is output from the amplification circuit 40 after the output signal 104 from the delay circuit string is input into the pulse control circuit 130, that is, the propagation time of the internal clock signal 4 in the pulse generating circuit 130 and the amplification circuit 40, is set to t2, and propagation times in the delay circuit string in the first period and the second period are set to td.

The delay time of the delay circuit 112 is predetermined such that a sum of the propagation times in the delay circuit 112 and the AND circuit 113 becomes t1+t2. The time during the first control signal 101 is at a high voltage is equal to the cycle time tCK, and since the cycle time tCK is equal to the propagation time in the first period propagating in the delay circuit 112, the AND circuit 113, and the delay circuit string, after the delay circuit control signal 101 has risen, tCK is represented as tCK=t1+t2+t3+t4.

In the second period, the total time until the internal clock signal is output after starting from the external clock signal 1 is input into the receiving circuit 10, the delay circuit control signal has fallen, passing through the delay circuit string 120, the pulse generating circuit 130, and the amplification circuit 40, is equal to t1+t2+t3, which is simply the cycle time, tCK. That is, the internal clock signal 4 is output at the same timing as that of the external signal in the third period.

Therefore, the phase difference between the internal clock signal and the external clock signal can be removed within two cycles.

A delay time of the delay circuit string in the case of a slight change of the clock signal is described with reference to FIG. 14 which shows detailed operational waveforms of the nodes A8 and B8. FIG. 14 is a timing chart for explaining variations of the delay time of the delay circuit string in the case of a slight change of the clock signal.

In FIG. 14, the node B8 is first discharged to the intermediate potential and then charged again. When the clock cycle is extended slightly, the propagation time in the delay circuit string in the first period is extended, and the amount of charge to be discharged at the node B8 increases. Accordingly, the charge quantity to be charged in the second period increases in order to extend the propagation time in the delay circuit string 120 in the second period.

Thus, since the generation timing of the clock signal 105 is delayed, a signal is obtained which is in synchronism with the external clock signal of the next clock cycle. This means that the resolution of the clock cycle is less than one gate step. Thus, as far as the relationship between the amount of charge and the discharge time is linear, the phase difference between the external clock and the internal clock does not change, even if the cycle time changes.

The current capacity and the parasitic capacitance of the two P-type MOSFETs forming a pair are the same, and similar to the two N-type MOSFETs. The charging time of the node Ak in the first period is completely cancelled by the charging time of the node Bk in the second period. The charging time of the node Bk in the first period is completely cancelled by the charging time of the node Ak in the second period. In the case of FIG. 13, the propagating times from the node B0 to the node A8 are cancelled and no accumulation is observed in the difference of the propagation time to be caused by the propagation in the delay circuit string in the first and second periods.

Dispersion of the timing due to the variation of the cycle time originats only due to the charging and discharging at the node B8, and the dispersion does not exceed one gate level. Thus, the propagation time for propagating in the delay circuit string 120 in the first period coincides with the propagation time for propagating in the delay circuit string 120 in the second circuit within the accuracy of one gate level, that is, the phase difference between the internal clock signal and the external clock signal is less than one gate level.

As shown above, the inventor of the present invention provides a circuit, capable of obtaining an internal clock signal which has no delay with the external clock signal within two cycles, and no power consumption is required while waiting, since it is not necessary to operate the circuit and the circuit can be stopped when the internal clock is not used.

Now, the technique described above is related to the technique for satisfying the double data rate specification. However, a new specification has been proposed, capable of continuously outputting the four data within one cycle time for responding to the recent demand for further high speed operation. FIG. 15 is a timing chart showing the operation for outputting four data within one clock cycle. As shown in FIG. 15, after the read command is read at a rise of a clock, the data Q1 to Q4 are continuously output. The above-described circuit may be a candidate which realizes the above specification, without causing problems associated with RDLL or SMD described above.

FIG. 16 is a diagram showing a circuit utilizing a conventional basic circuit structure in order to realize a specification of reading the data of four clocks continuously. In FIG. 16, the numeral 11 denotes a receiving circuit, comprising a circuit for detecting an edge of the external clock signal 1, for outputting an internal clock 2. The numeral 12 denotes a D flip-flop, whose D input end is connected to the output of the reversed output end, for outputting a signal whose logic level is reversed each time when the internal clock is input. The numeral 24 denotes a delay circuit string, to which the internal signal 2 and the output of the D flip-flop are input. This delay circuit string 24 outputs the clock signals for realizing the specification of reading the data of four clocks continuously. The specification shown in FIG. 15 is constituted such that the data are read after two clock cycles have elapsed. In order to avoid a problem that, if only a delay circuit string 24 is provided, no operation is executed in the next clock cycle after the read command is input, the delay circuit string 25 constituted by the same circuit structure as the above delay circuit string 24 is also provided.

Next, the delay circuit string 24 will be described in detail hereinafter. The delay circuit string 24 comprises the D flip-flop 100, four sets of delay circuits 111, 611, 711, and 811, four sets of delay circuit string s 112, 612, 712, and 812, four sets of pulse generating circuit 113, 613, 713, and 813, and a multiplexer.

An internal clock 2 is input into the clock end of the D flip-flop 100, and the output end of the D flip-flop is connected to the D input end. The first control signal 101 is output from the output end of the D flip-flop and the second control signal is output from the reversed output end.

The first control signal 101 is input into one of the input ends of the AND circuits and the delay circuits 111, 611, 711, and 811, and the other input ends of the AND circuit are connected to the output ends of the of the delay circuit 111, 611, 711, and 811. Thus, the control signals 103, 603, 703, and 803 output from respective AND circuits are only output when the first control signal is at a high voltage, and the first signals which have been propagated through the delay circuits 111, 611, 711, and 811 are input into the AND circuits.

The delay circuit strings 112, 612, 712, and 812, similar to the above-described conventional technique, make the input control signals propagate toward the right and left sides of the figure for causing the delay of signals. In the delay circuit string 112, the delay times obtained when propagating toward the right and left sides are identical. However, in the other delay circuit strings 612, 712, and 812, the delay times toward right side differ from the delay times towards the left side. In the delay circuit string 611, the ratio of the delay time toward the right side to the delay time toward the left side is 4:1, and, in the delay circuits 712 and 812, the ratio are 4:2 and 4:3, respectively.

FIG. 17 is a circuit diagram showing the internal structure of the delay circuit string 112. As shown in FIG. 17, the internal structure of the delay circuit string 112 is the same as that of the delay circuit string 120 shown in FIG. 11. FIG. 18 is a circuit diagram showing the structure of the delay circuit string 612, in which the delay time toward the right side differs from that toward the left side. As shown in FIG. 18, in the delay circuit string 212, four sets of N-type MOSFETs are connected in parallel to the ground line from the node An, and to the power source line, only one set of N-type MOSFET is connected. In contrast, a set of N-type MOSFET is electrically connected to the ground line from the node Bn, and four sets of N-type MOSFETs are connected in parallel to the power source line.

In the first period wherein the first control signal 101 is at a high voltage, and the second signal 102 is at the low voltage, the node An is charged by one set of P-type MOSFETs, and the node Bn is discharged by one set of N type-MOSFETs. In the second period wherein the first control signal 101 is at the low voltage and the second control signal 102 is at the high voltage, the node An is discharged by four sets of N-type MOSFETs, and the node Bn is charged by four sets of MOSFETs. Therefore, the propagation time through the delay circuit string 612 in the second period becomes about 1/4 of the propagation time in the first period.

Although the delay circuit strings 714, 8114 have almost the same structure as that of the delay circuit string 614, there is a slight difference in structure. The propagation time through the delay circuit string 712 in the second period is 2/4 that of the first period, and the propagation time through the delay circuit 812 in the second period is 3/4 that of the first period. The difference between the propagation times associated with the structural differences is shown in FIG. 27 of Japanese Patent Application, First Publication No. Hei 11-66854 (Japanese Patent Application No. Hei 9-152656), which is previously filed by the same inventor as this application.

Assuming that the delay time of the receiving circuit 11 is t1, delay times of the output circuits such as the pulse generating circuit 113, the multiplexer 16 and 13 are t2, and the overhead time is t3, the delay times of respective delay circuits 111, 611, 711, and 811 are set to one time, 4/1 time, 4/2 time and 4/3 time of the time t1+t2+t3. The reason for these settings the delay times of respective delay circuits 111, 611, 711, and 811 is for setting the phase differences between the phase of the data 5 described below and the external clock signal 1 to be input at 0°, 270°, and 360°. Here, the structures of respective delay circuits 111, 611, 711 and 811 are constructed in the same circuit structure as those of the receiving circuit 11 and the output circuits in order to follow change of properties of these delay circuits 111, 611, 711, and 811 such as the delay time caused by, for example, thermal fluctuation after the change of properties of the receiving circuit 11 and the output circuit.

Now, returning to FIG. 16, the pulse generating circuits 113, 613, 713, 813 detect the rise of the delay circuits output signals 104, 604, 704, and 804 output from the delay circuits strings 112, 612, 712, 812, and output a pulse signal having a predetermined width, preferably a width of 1/4 cycle the clock signal. The multiplexer 13 multiplexes pulse signals output from the pulse generating circuits 113, 613, 713, and 813, and outputs the multiplexed signal. The multiplexer 13 multiplexes a multiplexed pulse signal output from the delay circuit string 24, and a multiplexed pulse signal output from the delay circuit 25, and outputs the resultant multiplexed pulse signal as an internal clock signal. The numeral 14 denotes a memory cell and the numeral 15 denotes a D flip-flop for outputting the memory content stored in the memory cell 14 in synchronism with the input internal clock signal 4. The memory cell 14 and the D flip-flop are not shown in figures.

Next, the operation of the above described circuit is explained hereinafter.

FIG. 19 is a timing chart showing the operation of the circuit formed according to the conventional basic circuit structure, in order to realize a specification for reading data for four clocks continuously.

When the external clock 1 is input, the receiving circuit 11 detects a rising edge and outputs an internal signal 2 having a predetermined width. The internal clock 2 is input into D flip-flops 12 and 100 for outputting control signals 101, 102. In the first period wherein the potential of the control signal 101 is high and the potential of the control signal 102 is low, the control signal 103 is output from the AND circuit after a time t111 required for propagating in the delay circuit has been passed, and the control signal 803, 703, and 603 are sequentially output after the times t811, t711, and t812 have been passed.

When these control signals are output, the delay circuit string 112, 612, 712, and 812 become low potentials, since the contact point B0 of the delay circuit 112, 612, 712, and 812 is discharged in sequence. Since the contact point A0 is charged as the contact point B0 is discharged, the edge signal propagates in the delay circuit strings 112, 612, 712, and 812 toward the right side of the figure. While the edge signal is propagating in the delay circuit strings 112, 612, 712, and 812, the delay circuit string output signals 194, 604, 704, and 804 remains at low potential.

While the edge signal propagates each delay circuit string 112, 612, 712, and 812 toward the right side and the potential of the first control signal becomes low and the first control signal is inverted to the high level, the discharging node Bk is charged due to conversion of the P-type MOSFET into a conductive state, since the potential of the control signal 101 becomes 101 low while the node Bk+1 is left at low potential, and subsequently the node Ak is discharged. Accordingly, when the first control signal rises and when the second control signal 102 falls, the edge signal first propagating toward the right side of the figure in each delay circuit string is reversed for propagating in the left direction. To sum up, the time point when the first control signal 101 rises and the time point when the second control signal falls define the point where the propagation direction is reversed.

During the time in which the edge signal is propagated, respective delay circuit strings 112, 612, 712, and 812 in the right direction are respectively set to t112 for the delay circuit string 112, t612/4 for the delay circuit string 612, t712/2 for the delay circuit string 712, and t812*3/4 for the delay circuit string 812. Accordingly, the contact point B0 of the delay circuit string 612 is inverted to the high potential and the delay circuit string output signal 604 is inverted to the high potential when the time t612/4 has passed after the rising time point of the first control signal 101 and the falling time point of the second control signal 102. Subsequently, the contact point B0 of the delay circuit string 712 is inverted to the high potential and the delay circuit string output signal 704 is inverted to the high potential when the time t712/2 has passed after the rising time point of the first control signal 101 and the falling time point of the second control signal 102; the contact point B0 of the delay circuit string 812 is inverted to the high potential and the delay circuit string output signal 804 is inverted to the high potential when the time t812*3/4 has passed after the rising time point of the first control signal 101 and the falling time point of the second control signal 102. Finally, the contact point B0 of the delay circuit string 112 is inverted to the high potential and the delay circuit string output signal 104 is inverted to the high potential when the time t112 has passed after the rising time point of the first control signal 101 and the falling time point of the second control signal 102.

When the delay circuit string output signals 104, 604, 704, and 804 are inverted to the high voltage, a pulse, having a pulse width of the a quarter of the external pulse clock tCK, is generated at each pulse generating circuit 113, 613, 713, and 813. Thus, the phase of the pulse signal 105 output from the pulse generating circuit 113 is 0° compared with that of the external clock signal 1, the phase of the pulse signal 605 output from the pulse generating circuit 613 is 90° compared with that of the external clock signal 1, the phase of the pulse signal 705 output from the pulse generating circuit 713 is 180° compared with that of the external clock signal 1, and the phase of the pulse signal 805 output from the pulse generating circuit 813 is 270° compared with that of the external clock signal 1. Thereby the pulse signals which satisfy the specification shown in FIG. 15 for the external signal are obtained.

The pulse signals which satisfy the specification shown in FIG. 15 can be obtained by the technique described above. These pulse signals can be obtained by the above-described technique for the delay circuit string 112 by using transistors having equal sizes, because the propagation time of the edge signal to the right and the left directions are the same in this case. However, the propagation times to the right and left directions are different in other delay circuit strings 612, 712, and 812, and the ratios of the propagation times are not adjustable by the sizes of transistors. One of the measures to adjust the ratios is shown in the tenth embodiment of Japanese Patent Application, First Publication No. Hei 11-66854 (Japanese Patent Application No. Hei 9-152656). However, a first problem arises in that the setting and measurement of delay times are complicated, because delay times for the delay circuit strings 612, 712, and 812 must be different from those for the delay circuits 611, 711, and 811.

In the circuit shown in FIG. 16, the delay times for the delay circuits 111, 611, 711, and 811 are respectively set to one time, 4/1 times, 4/2 times, and 4/3 times of the total time t1+t2+t3. However, a second problem arises in that the formation of a circuit having the 4/3 times is quite difficult, since the delay circuits 111, 611, 711 and 811 are formed by combining one or a plurality of the same circuit as the receiving circuit 11 or the output circuit.

Furthermore, in the case of watching the operational speed, the minimum cycle time for the delay circuit string 612 is degraded four times worse than that of the delay circuit string 114. For example, assuming that a sum t1+t2 of the delay time t1 of the receiving circuit 11 and that t2 of the output circuit is 3 ns, and the overhead time t3 is 4 ns, the operational frequency of the delay circuit string 612 degrades from 143 MHz to 36 MHz. In order to avoid the above degradation, if the ninth embodiment of the above application, that is, Japanese Patent Application, First Publication No. Hei 11-66854 (Japanese Patent Application No. Hei 9-152656) is used, the third problem arises that the ratios of the propagation times in respective delay circuit strings 612, 712, and 812 toward the right and left directions becomes 5:4, 6:4, and 7:4, which results making the first problem more explicit and complicated.

As shown in FIG. 18, since the delay time of the delay circuit 611 is set to 4/1 of the total time t1+t2+t3, the delay circuit is not normally operated if one cycle of the external clock signal is shorter than the delay time of the delay circuit 611, if the operating speed is increased by reducing the cycle time of the external clock signal. Thus, a problem is encountered that the operational frequency of the external clock 1 is restricted by the delay time of the delay circuit t611, which is four times of the total time t1+t2+t3, which means that the structure shown in FIG. 15 has problems in improving the operational frequency.

SUMMARY OF THE INVENTION

The present invention is carried out in order to solve the above problems, and the present invention has an objective to provide a semiconductor integrated circuit for generating pulse signals used for reading a plurality of data by one clock, capable of easily forming the circuit and capable of affording stable operations for facilitating measurement and setting of the semiconductor integrated circuit.

The present invention provides a semiconductor integrated circuit, which generates a plurality of pulse signals in synchronism with an external clock signal, comprising: a control signal outputting circuit for outputting a control signal in synchronism with the external clock signal; a first delay circuit for outputting a first delayed control signal, which is a delayed signal of said control signal for a predetermined time; a first delay circuit string, in which propagation times for propagating in a forward path and a backward path are set to the same time, a time for switching the propagation path from the forward path to the backward path is controlled by said control signal, for making an edge signal propagate reciprocatively when said first delay control signal is input; a second delay circuit for outputting a second delay control signal, which is a delayed signal of said control signal for a predetermined time; a second delay circuit string, in which, a ratio of the propagation time in the forward path to the propagation time in the backward path is set to a predetermined value, the edge signal is made propagating in the forward path when said second delay control signal is input, and a timing to switch the propagation path of the edge signal from the forward path to the backward path is controlled by an output signal output after reciprocatively propagating in said first delay circuit string; and a pulse generating circuit for generating a pulse signal from signals output from said first and second delay circuit strings.

The semiconductor integrated circuit according to the present invention further comprises: a third delay circuit string, provided in parallel with said second delay circuit, having the same propagation delay time ratio as that of the second delay circuit string, and in which a timing to switch the propagation path from forward to backward is controlled by the output signal from said second delay circuit string; a pulse generating circuit for generating a pulse signal from the signal output from said third delay circuit string; and a phase difference detecting circuit for detecting the phase difference between two pulse signals, one of which is generated by a signal output from said first delay circuit string and another one of which is generated by a signal output from said third delay circuit string.

In the semiconductor integrated circuit according to the present invention, the delay time of said second delay circuit is variable, and the semiconductor integrated circuit further comprises a control circuit for controlling the delay time of said second delay circuit based on the result of detection by said phase difference detection.

In the semiconductor integrated circuit according to the present invention, a ratio of a propagation time toward the forward direction to that toward the backward direction is set to 2:1.

In the semiconductor integrated circuit according the present invention, said semiconductor integrated circuit further comprises a multiplexer for multiplexing pulse signals generated by said pulse generating circuit.

In the semiconductor integrated circuit according to the present invention, the delay time in said first delay circuit is set by a sum of a delay time of an input circuit, a delay time of an output circuit, and an overhead time.

In the semiconductor integrated circuit according to the present invention, the delay time in said second delay circuit is set to twice the sum of a delay time of an input circuit, a delay time of an output circuit, and an overhead time.

In the semiconductor integrated circuit according to the present invention, said semiconductor integrated circuit comprises a plurality of said semiconductor integrated circuits in parallel and a multiplexer for multiplexing outputs of said plurality of semiconductor integrated circuits.

The present invention provides a semiconductor integrated circuit, which outputs a plurality of pulse signals in synchronism with an external clock signal, comprising: a control signal output circuit for outputting a control signal in synchronism with said external clock signal; a first delay circuit for outputting a first delayed control signal which is a delayed signal of said control signal for a predetermined time; a first delay circuit string, in which the propagation times for propagating in a forward path and a backward path, is set to the same, and a timing for switching the propagation path from the forward path to the backward path is controlled by said control signal, for making an edge signal propagate reciprocatively when said first delay control signal is input; a second delay circuit for outputting a second delay control signal, which is a delayed signal of said control signal, for a predetermined time; a second delay circuit string, in which a predetermined ratio of the propagation time in the forward path is set to the propagation time in the backward path, and which comprises a plurality of delay circuit strings in which edge signals are propagated in the forward path when said second delayed control signal is input, and a timing to switch the propagation path from the forward path to the backward path of a first delay circuit string adjacent to said first delay circuit string is controlled by an output signal after reciprocatively propagating in said first delay circuit string, and timings to switch the propagation path from the forward path to the backward path of the other delay circuit strings are controlled by each output signal output from each adjacent delay circuit signals; and a pulse generating circuit for generating a pulse signal from signals output from said first and second delay circuit strings.

In the semiconductor integrated circuit according to the present invention, said semiconductor integrated circuit further comprises: a third delay circuit string, provided in parallel with said second delay circuit, having the same propagation delay time ratio as that of the second delay circuit string, and in which a timing to switch propagation path from the forward path to the backward path is controlled by the output signal from said second delay circuit string; a pulse generating circuit for generating a pulse signal from the signal output from said third delay circuit string; and a phase difference detecting circuit for detecting the phase difference between two pulse signals, one of which is generated by a signal output from said first delay circuit string and another one of which is generated by a signal output from said third delay circuit string.

In the semiconductor integrated circuit according to the present invention, the delay time of said second delay circuit is variable and the semiconductor integrated circuit further comprises a control circuit for controlling the delay time of said second delay circuit based on the result of detection by said phase difference detection.

In the semiconductor integrated circuit according to the present invention, the ratio of the propagation time in the forward path to the propagation time in the backward path of each delay circuit string constituting said second delay circuit string is set to n:1 (n is a natural number).

In the semiconductor integrated circuit according to the present invention, the ratio of the propagation time in the forward path to the propagation time in the backward path of each delay circuit string constituting said second delay circuit string is set to 4:1.

In the semiconductor integrated circuit according to the present invention, said semiconductor integrated circuit further comprises a multiplexer for multiplexing pulse signals generated by said pulse generating circuit.

In the semiconductor integrated circuit according to the present invention, the delay time in said first delay circuit is set by a sum of a delay time of an input circuit, a delay time of an output circuit, and an overhead time.

In the semiconductor integrated circuit according to the present invention, the delay time in said second delay circuit is set to n (n is a natural number) times the sum of a delay time of an input circuit, a delay time of an output circuit, and an overhead time.

In the semiconductor integrated circuit according to the present invention, the delay time in said second delay circuit is set to four times the sum of a delay time of an input circuit, a delay time of an output circuit, and an overhead time.

In the semiconductor integrated circuit according to the present invention, said semiconductor integrated circuit comprises a plurality of said semiconductor integrated circuits in parallel and a multiplexer for multiplexing outputs of said plurality of semiconductor integrated circuits.

BRIEF DESCRIPTION OF THE DRAWINGS

FIG. 8 is a schematic diagram showing a structure of a conventional semiconductor integrated circuit.

FIG. 9 is a timing chart of a clock used in the conventional semiconductor integrated circuit.

DETAILED DESCRIPTION OF THE INVENTION

Hereinafter, a semiconductor integrated circuit according to several embodiments of the present invention will be described in detail with reference to the attached drawings.

FIRST EMBODIMENT

First, a semiconductor integrated circuit according to the first embodiment of the present invention will be described in detail with reference to the attached drawings.

Figure 1:
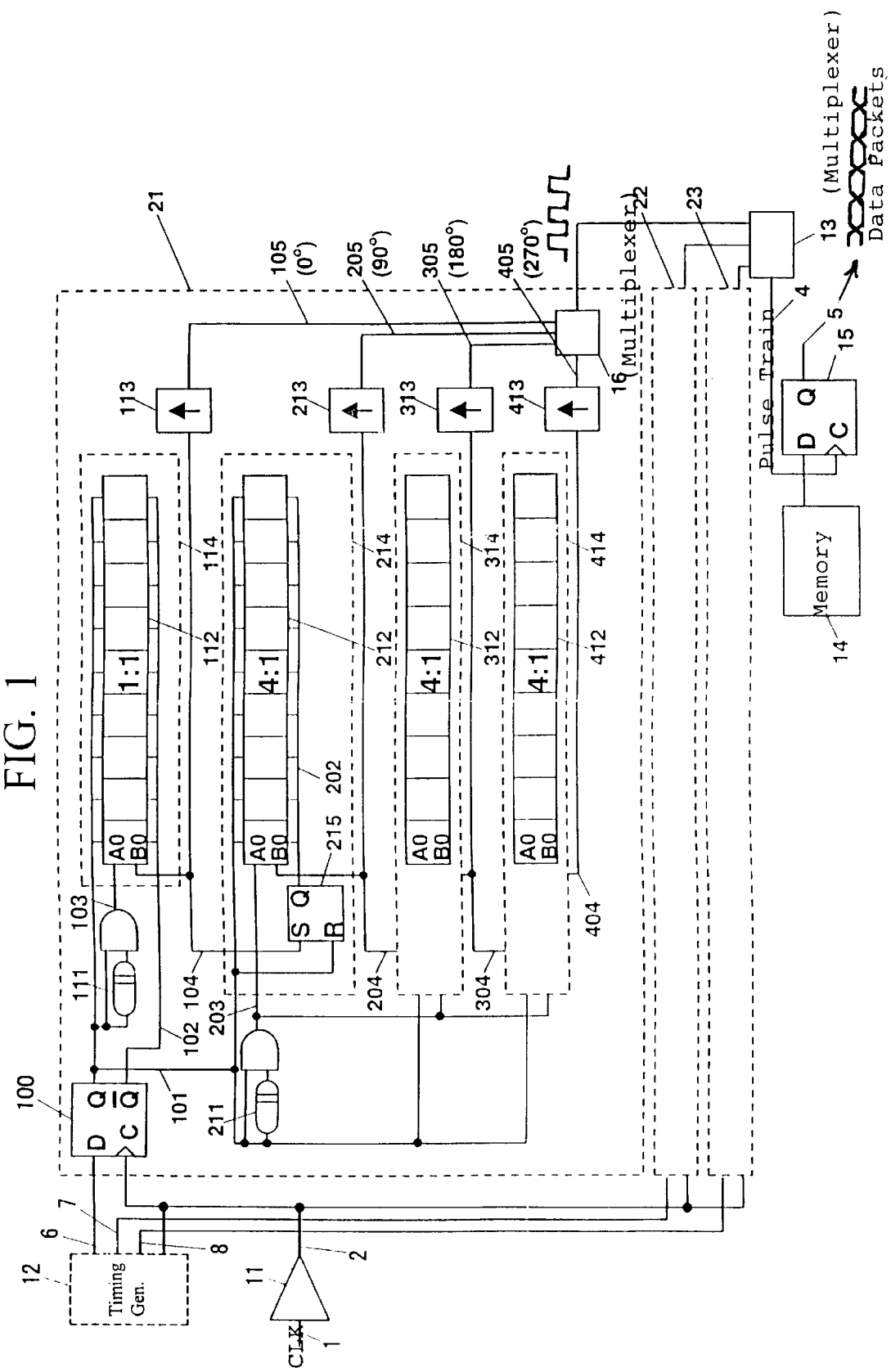
FIG. 1 is a block diagram showing a structure of a semiconductor integrated circuit according to the first embodiment of the present invention.

FIG. 1 is a block diagram showing a structure of a semiconductor integrated circuit according to the first embodiment of the present invention.

Figure 2:
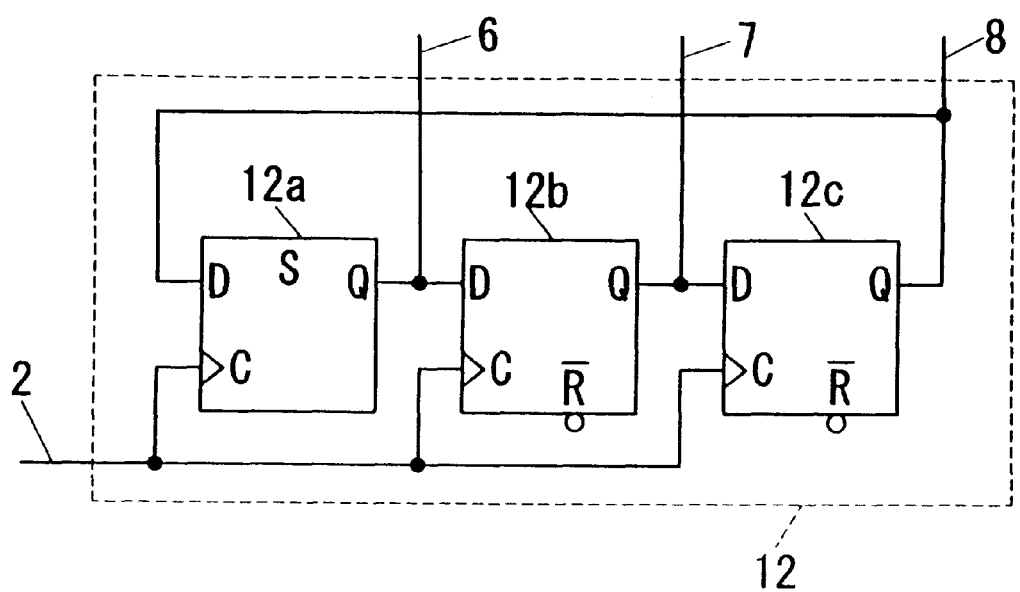
FIG. 2 is a block diagram showing an internal structure of a timing signal generating circuit.

In FIG. 1, the numeral 11 denotes a receiving circuit (an input circuit), which has a circuit for detecting edges of the inputting external clock signals 1, and which outputs internal signals. The numeral 12 denotes a timing signal generating circuit for generating timing signals for determining the operational timings of delay circuit strings 21, 22, and 23, which will be described below, and the timing signal generating circuit 12 generates, each time that an internal signal is input, a timing a signal, in which one of the signal line 6, 7 and 8 is inverted to the high potential, while others remain at the low potential. FIG. 2 is a block diagram showing an internal structure of a timing signal generating circuit.

As shown in FIG. 2, the timing signal generating circuit 12 is constituted by three D flip-flops 12a, 12b, and 12c dependently connected to each other, the internal signal 2 is input to each D flip-flop, and the output of the D flip-flop 12a is connected to the input end of the D flip-flop 12b, the output of the D flip-flop 12b is connected to the input end of the D flip-flop 12c, and the output of the D flip-flop 12c is connected to the input end of the D flip-flop 12a, and at the output ends of the D flip-flops 12a, 12b, and 12c are connected to signal lines 6, 7, and 8, respectively. The D flip-flop 12a is provided with a set terminal and other D flip-flops 12b and 12c are provided with reset terminals. The D flip-flop 12a is set to "1" and the other D flip-flops 12b and 12c are set to "0" by a previously internally generated reset signal. Thus, when the internal signal 2 is input, only the signal line 6 is inverted to the high potential, when the next internal signal 2 is input, only the signal line 7 is inverted to the high potential; when the next internal signal 2 is input, then only the signal line 8 is inverted to the high potential; when the further internal signal 2 is input, the signal line 6 is then inverted to the high potential; and when the next internal signal 2 is input, the same operations are repeated each time the internal signal 2 is input.

Figure 16:
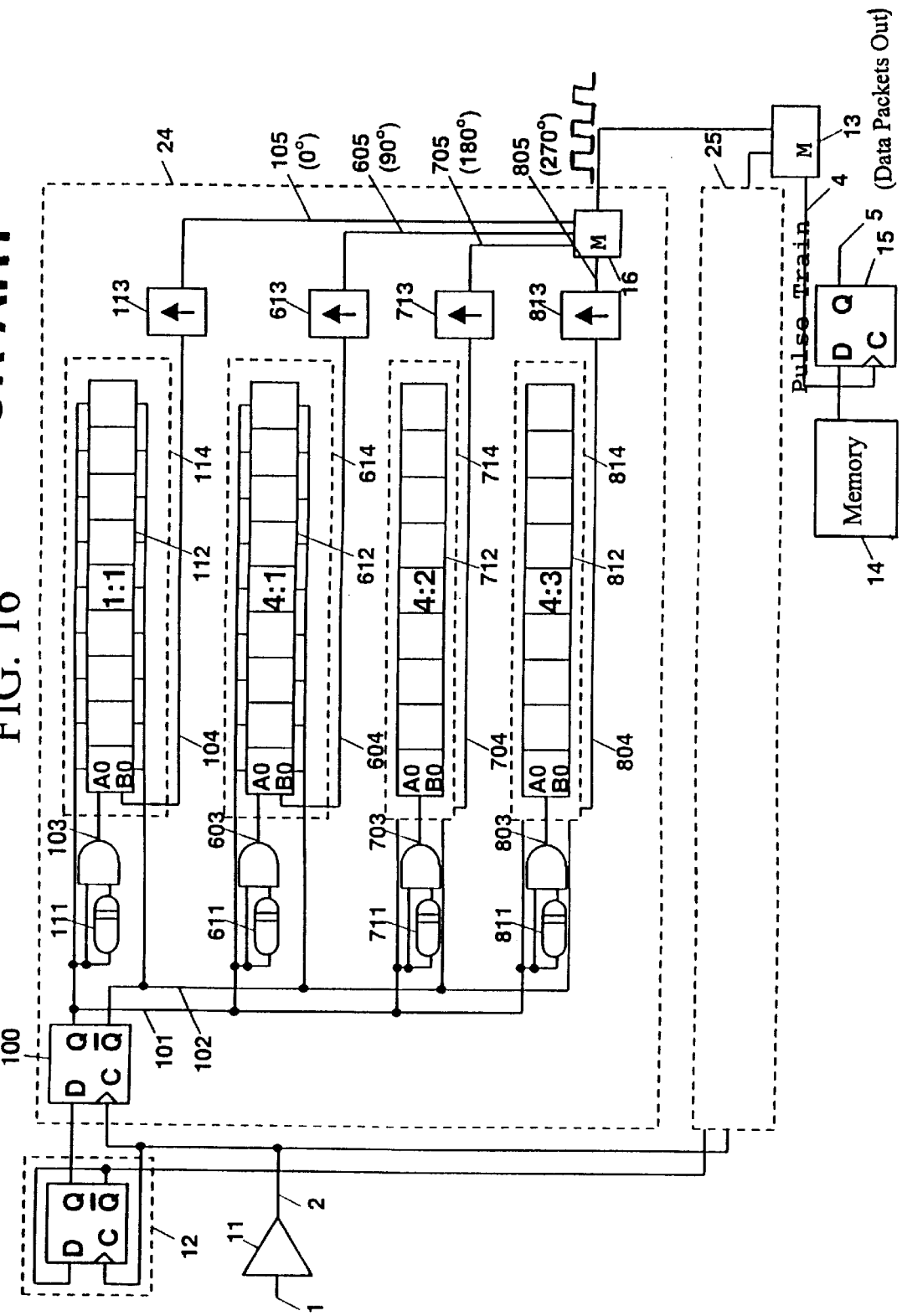
FIG. 16 is a diagram showing a circuit to which the conventional basic circuit structure is applied, in order to provide a specification for reading data continuously for four clocks.

The reference numeral 21 denotes a delay circuit string, in which the internal signal 2 and the output of the timing signal generating circuit 12 are input. The presence of this delay circuit string distinguishes the present circuit from the circuit shown in FIG. 16. In this embodiment, the other delay circuit strings 22 and 23, which have the same structure as that of the delay circuit string 21, are provided in parallel with the delay circuit string 21.

Hereinafter, the delay circuit string 21 is described in detail. The delay circuit string 21 has a D flip-flop 100. The internal signal 2 is input into a clock end of the D flip-flop 100, and the output end of the timing signal generating circuit 12 is connected to the D input end. The first control signal 101 is output from the output end of the D flip-flop, and the second control signal 102 is output from the reversed output end of the d flip-flop. A circuit constituted by the delay circuit 111 and the AND circuit, and a circuit constituted by the delay circuit 211 and the AND circuit are connected to the output end of the D flip-flop which outputs the first control signal 101. The first control signal 101 is input into the input end of the delay circuit 111 and one of input ends of the AND circuit, and the output of the delay circuit 211 is input into another end of the AND circuit. A delay circuit 114 is connected to the output end of the AND circuit, and a control signal 103 output from the AND circuit is input into the delay circuit 114. The first control signal is also input into the input end of the above-described delay circuit 211 as well as one of input ends of the AND circuit, and the output of the delay circuit 211 is input into another input end of the AND circuit. Three delay circuits 214, 314, and 414 are connected to the output end of the AND circuit and the control signal 103 output from the AND circuit is input into these delay circuits.

The delay time of the above-described delay circuit 211 is set to four times of the overhead time t3, and the delay circuits 111, 211, 311, and 411 are constructed by one or a plurality of circuits having the same structure as the receiving circuit 11 and the output circuit, in order to prevent the change of characteristics due to environmental changes such as a temperature change. The delay time of the delay circuit 111 is set to the sum of the delay time t1 of the receiving circuit 11, the delay time t2 of the output circuit, and the overhead time t3. The term "overhead time" used in this embodiment includes delay times of the D flip-flop 100, the pulse generating circuit 113, the multiplexer 16, and the other multiplexer 13.

Figure 17:
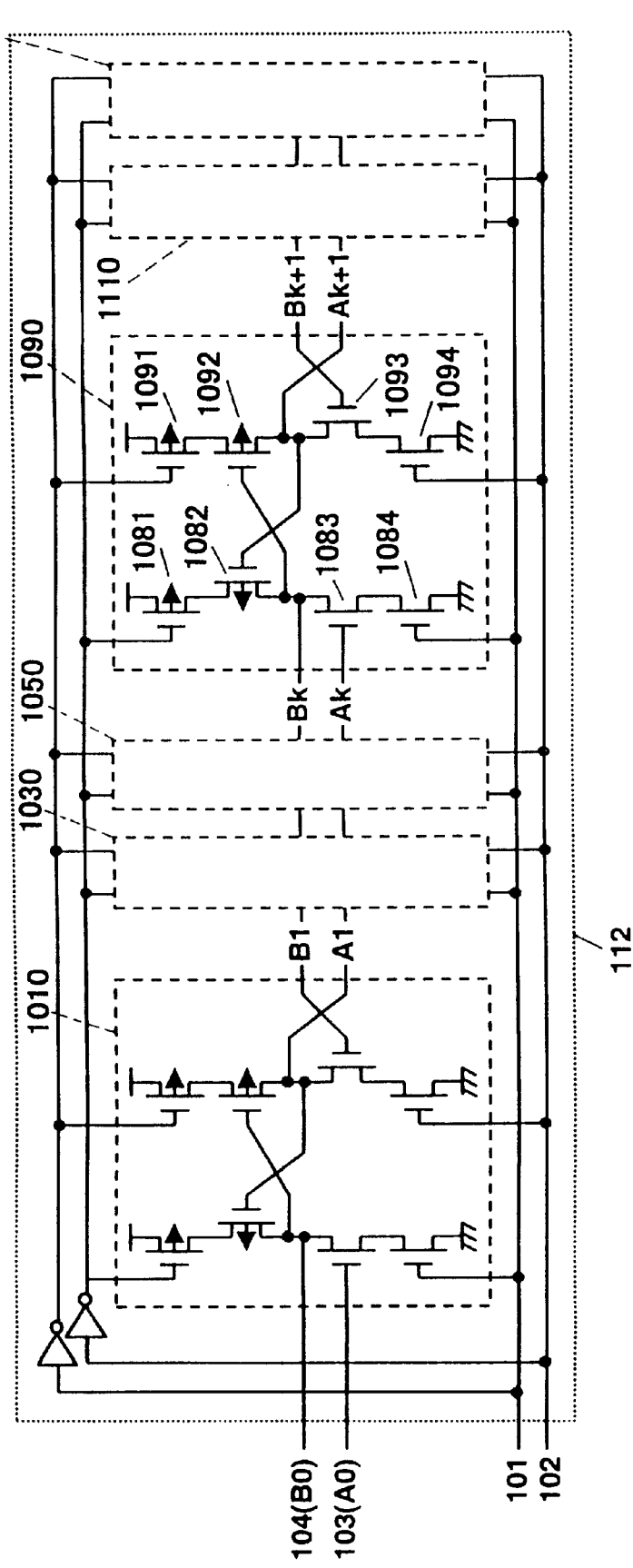
FIG. 17 is a circuit diagram showing the internal structure of a delay circuit string 112.

The above described delay circuit 114 includes a delay circuit string 112, and, in addition to the above described controls signal 103, the first control signal 101 and the second control signal 102 are also input into the above delay circuit 114. The controls signal 103 is input into the contact point A0 of the delay circuit string 112, and when the control signal 103 is input into the contact point A0, while the first control signal 101 is at the high potential and the second control signal 102 is at the low potential, the delay circuit string 112 makes the edge signal propagate toward the right direction of FIG. 1. In contrast, when the first signal 101 is at the low potential and the second control signal 102 is at the high potential, the delay circuit string 112 makes the edge signal propagate toward the left direction of FIG. 1. In the delay circuit string 112, the propagation time of the edge signal toward the right direction is set to the same as the propagation time toward the left direction, and the internal structure of the delay circuit string is constituted as shown, for example, in FIG. 17. The delay circuit string output signal 104 is output from the contact point B0 after propagating the edge signal toward the right and left directions.

The signal 203 output from the AND circuit and the first control signal 101 are input into the above described delay circuits 214, 314, and 414, but the second control signal 102 is not input into these delay circuits 214, 314, and 414, in contrast to the above described delay circuit 114. The delay circuit 214 includes the SR flip-flop 215 and a delay circuit 212. The delay circuit output signal 104, output from the above described delay circuit string 112, is input into the S input end of the SR flip-flop 215, and the first signal is input into the R input end of the SR flip-flop. In other words, when the delay circuit string output signal 104 is at the high potential, the output end Q of the SR flip-flop 215 is inverted to the high potential, and when the first control signal is at the high potential, the output end Q becomes the low potential. The control signal 203 output from the AND circuit as well as the first control signal are input into the contact point A0 of the delay circuit string 212, similar to the case of the above described delay circuit string 112. Furthermore, instead of the second control signal 102 being input to the above described delay circuit 112, the output of the SR flip-flop 215 is input into the delay circuit string 212 as the control signal 212. In other words, the second control signal is used for defining the timing of the edge signal for propagating the edge signal toward the left direction in FIG. 1, and this timing is controlled by the delay circuit output signal 104 string output signal 104, output from the delay circuit string 112.

Figure 18:
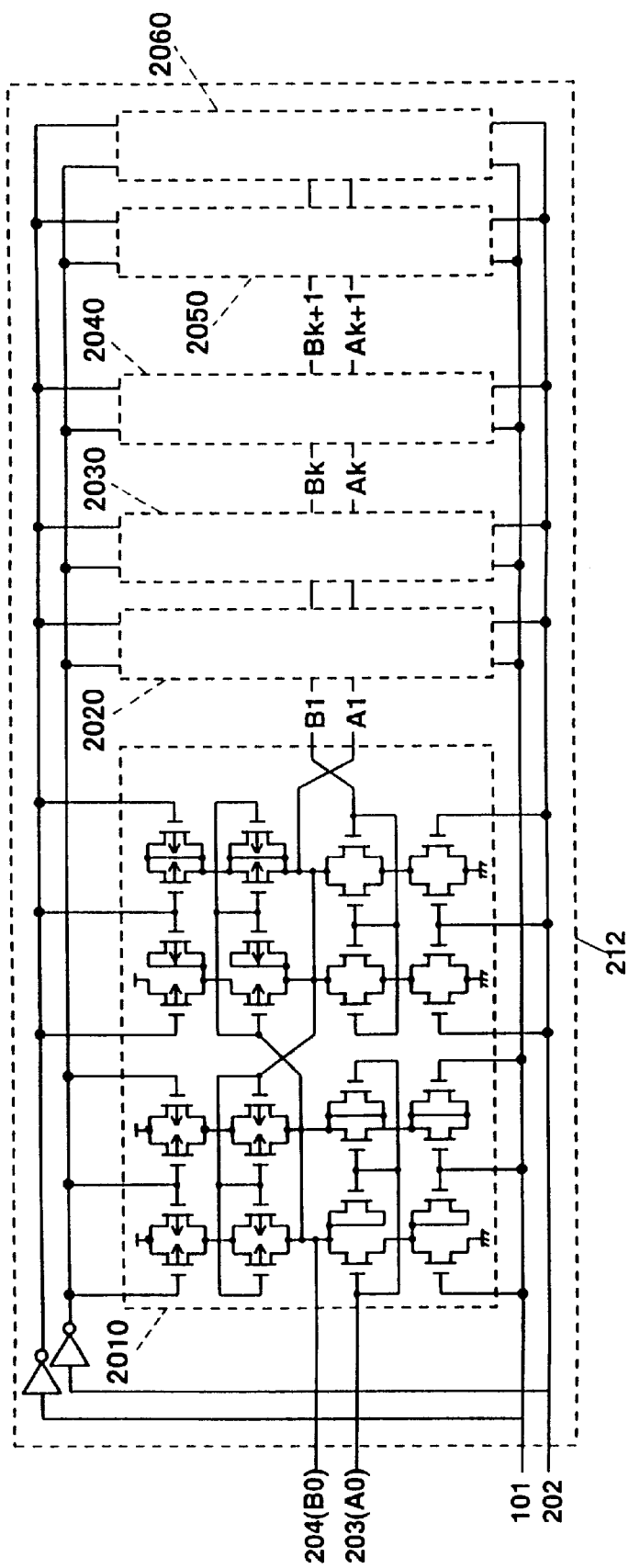
FIG. 18 is a circuit diagram showing the structure of a delay circuit string 612, in which the propagation time for an edge signal to propagate in the right direction in FIG. 15 differs from the propagation time for the edge signal to propagate in the left direction in FIG. 15.
Figure 19:
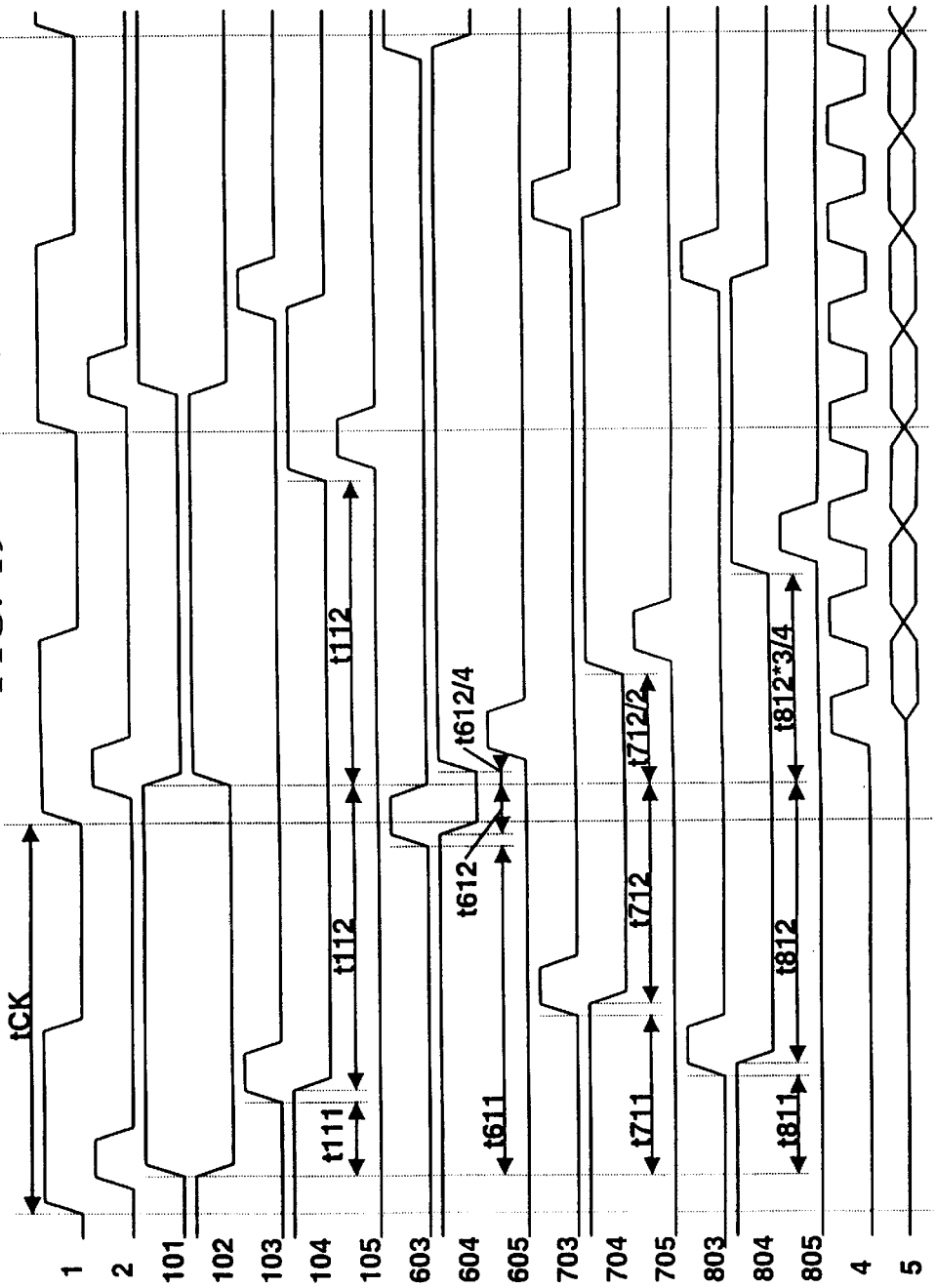
FIG. 19 is a timing chart showing an operation of the circuit, to which the conventional basic circuit structure is applied, in order to provide a specification for reading data continuously for four clocks.

The ratio of the time for propagating the edge signal in the delay circuit string 212 to the time for propagating the edge signal in the delay circuit string 212 is set to 4:1. The internal structure of the delay circuit string 212 is constituted by the same circuit structure as that shown in FIG. 18. The delay circuit string output signal 204 is output from the contact point B0 of the delay circuit string 212.

The structures of the delay circuits 314 and 414 are the same as that of the delay circuit 214, and the delay circuit string output signal 204 is input into the S input end of the SR flip-flop (not shown) provided in the delay circuit 314, and the delay circuit string output signal 304, output from the contact point B0 of the delay circuit string 312, is input into the S input end of the SR flip-flop provided in the delay circuit 414. Therefore, the delay circuit string output signal 204 controls the timing for propagating the edge signal in the right direction in the delay circuit 312, and the delay circuit string output signal 304 controls the timing for propagating the edge signal in the left direction in the delay circuit 412.

Furthermore, the delay circuit string output signal 104 is input into the pulse generating circuit 113, and the delay circuit string output signals 204, 304, and 404 are input respectively in the pulse generating circuits 213, 313, and 413. The pulse generating circuits 113, 213, 313, and 414 detect the rises of the delay circuit string output signals 104, 204, 304, and 404, output respectively from the delay circuit strings 104, 204, 304, and 404, and output respective pulse signals having a predetermined pulse width, preferably a pulse width of a quarter cycle of the clock signal. The multiplexer 16 multiplexes the pulse signals 105, 205, 305, and 405, respectively output from the pulse generating circuits 113, 213, 313, and 414 and outputs the multiplexed signal. The multiplexer 13 multiplexes the multiplexed signal, output from the delay circuit string 21, and the multiplexed signal, output from the delay circuit strings 22 and 23, and outputs the multiplexed signal as an internal signal 4.

The numeral 14 denotes a memory cell and 15 denotes a D flip-flop (output circuit) for outputting data corresponding to the memory content stored in the memory cell 14 from the data outputting terminal 5 in synchronism with the inputting clock signal 4. In the present specification, descriptions of the memory cell and the D flip-flop are omitted for simplification.

The operation of the semiconductor integrated circuit according to the first embodiment of the present invention is described hereinafter.

Figure 3:
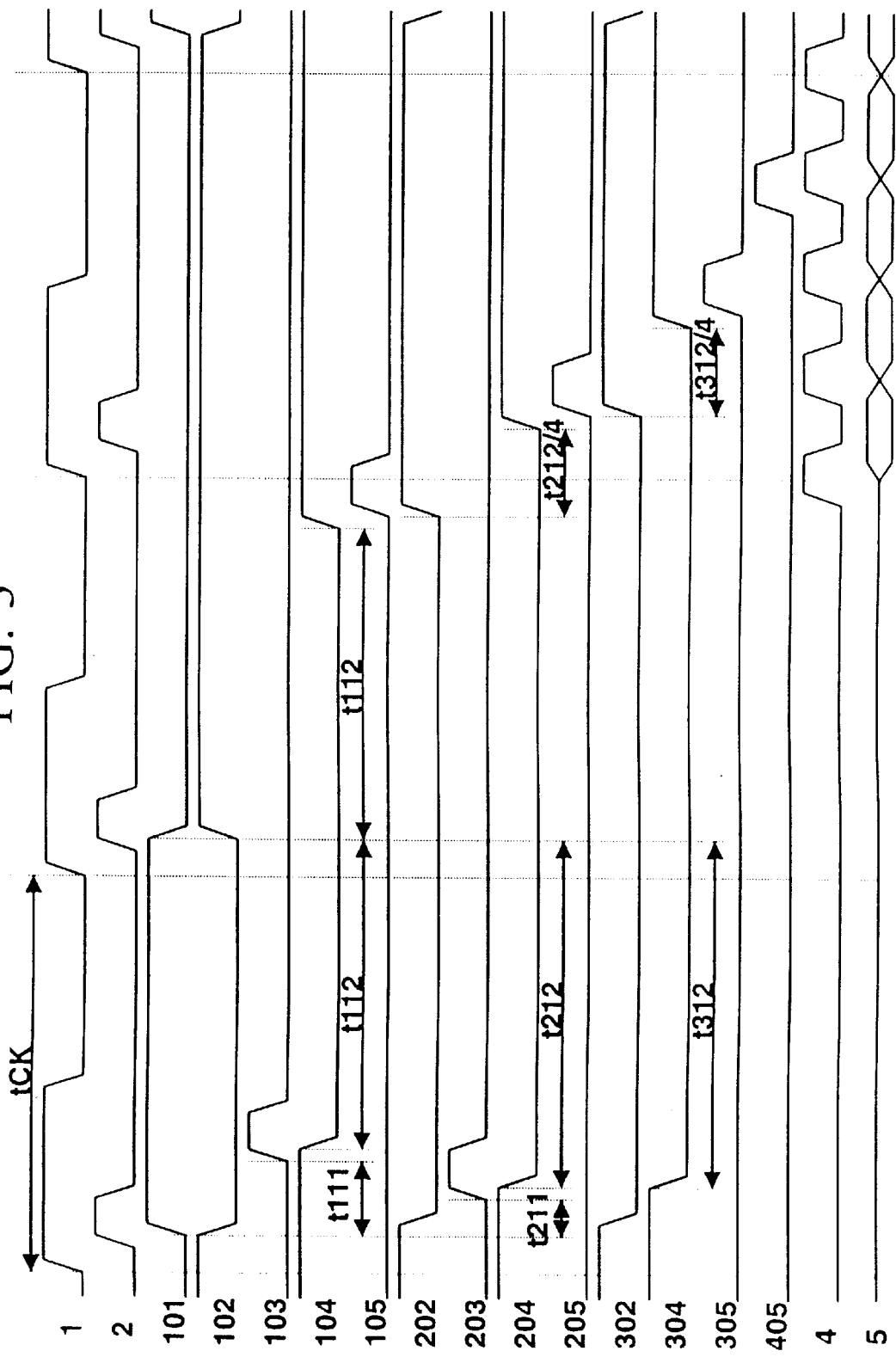
FIG. 3 is a timing chart showing an operation of the semiconductor integrated circuit according to the first embodiment of the present invention.

FIG. 3 is a timing chart showing the operation of the semiconductor integrated circuit according to the first embodiment of the present invention.

When the external clock 1 is input, the receiving circuit 11 is activated and executes detection of the edge, and outputs an internal signal 2 constituted by a pulse having a predetermined width. The internal clock signal is input into the timing generating circuits 12 and 100, which output control signals 101 and 102. In the first period wherein the first control signal is in the high potential and the second control signal is at the low potential, the control signal 103 is output from the AND circuit after the time t111 necessary for propagating the delay circuit 111 has been passed; and the control signal 203 is output from the AND circuit after passing the time t112 necessary for propagating the delay circuit 203.

When these control signals 103 and 203 are output, the edge signal propagates through the delay circuits 112, 212, 312, and 412 in the right direction of the figure. When the next external signal is input, the internal signal 2 is output from the receiving circuit 10 and the internal signal 2 is input into the D flip-flop 100. At this time, the first control signal 101, output from the D flip-flop 100, is at the low potential, and the second control signal 102 is at the high potential. In the delay circuit string 112, into which both of the first control signal 101 and the second control signal 102 are input, the edge signal, propagating in the delay circuit string 112 towards the right direction, begins to propagate in the delay circuit string 112 at a timing when the first control signal 101 is inverted to the low potential and the second control signal 102 is inverted to the high potential.

In the delay circuit strings 212, 312, and 412, since the delay circuit string output signal 104 is at the low potential even if the first control signal 101 is inverted to the low potential, the second control signal is not inverted to the high potential. Thus, the edge signals, propagating in the delay circuit strings 212, 312, and 412, suspend propagating in both the right nor the left directions and the propagation stops.

When the time t111 has been passed after the first control signal 101 is inverted to the low potential and the second potential is inverted to the high potential, the edge signal, propagating in the delay circuit string 112, reaches the contact point B0 and the potential of the contact point B0 becomes high. As a result, the delay circuit string output signal 104 is changed to the high potential.

When the delay circuit string output signal is changed to the high potential, the pulse signal 105 is output from the pulse generating circuit 113 at a timing shown in FIG. 3.

In addition, when the delay circuit string output signal is changed to the high potential, the output Q of the SR flip-flop is changed to the high potential, since the first control signal is at the low potential, the edge signal, whose propagation has been stopped, begins to propagate in the delay circuit string 212 in the left direction. Since the propagation delay ratio in the delay circuit string 212 is set to 4:1, the time necessary for the edge signal to reach the contact point B0 is a quarter of the time t212 necessary for the edge signal to propagate in the delay circuit in the right direction. Therefore, when a quarter of the time t212 passes after the delay circuit string output signal 104 has been changed to the high potential, the delay circuit string output signal 204 is inverted to the high potential. When the delay circuit output signal 204 is inverted to the high potential, the pulse signal 205 is output from the pulse generating circuit 213 at a timing shown in FIG. 3.

In addition, when the delay circuit string output signal 204 is changed to the high potential, the output Q of the SR flip-flop (not shown) in the delay circuit 312 is changed to the high potential, and since the first control signal 101 is at the low potential, the edge signal, while stopping propagation in the delay circuit string 312, starts propagating in the delay circuit string 312. The propagation delay ratio in the delay circuit string 312 is set to 4:1, and thus the time for the edge signal to reach the contact point B0 is a quarter of a time t312 necessary for propagating in the delay circuit string 312 towards the right direction. Thus, when a quarter of the time t312 passes after the delay circuit string output signal 204 has been changed to the high potential, the delay circuit string output signal 304 is inverted to the high potential. When the delay circuit output signal 304 is inverted to the high potential, the pulse signal 305 is output from the pulse generating circuit 313 at a timing shown in FIG. 3.

Similarly, when the delay circuit string output signal 304 is changed to the high potential, the output Q of the SR flip-flop (not shown) in the delay circuit 312 is changed to the high potential, and since the first control signal 101 is in the at the low potential, the edge signal, while stopping propagation in the delay circuit string 412, starts propagating in the delay circuit string 412. The propagation delay ratio in the delay circuit string 412 is set to 4:1, the time for the edge signal to reach the contact point B0 is a quarter of a time t412 necessary for propagating in the delay circuit string 412 towards the right direction. Thus, when a quarter of the time t412 passes after the delay circuit string output signal 304 has been changed to the high potential, the delay circuit string output signal 404 is inverted to the high potential. When the delay circuit output signal 404 is inverted to the high potential, the pulse signal 405 is output from the pulse generating circuit 413 at a timing shown in FIG. 3.

Figure 15:
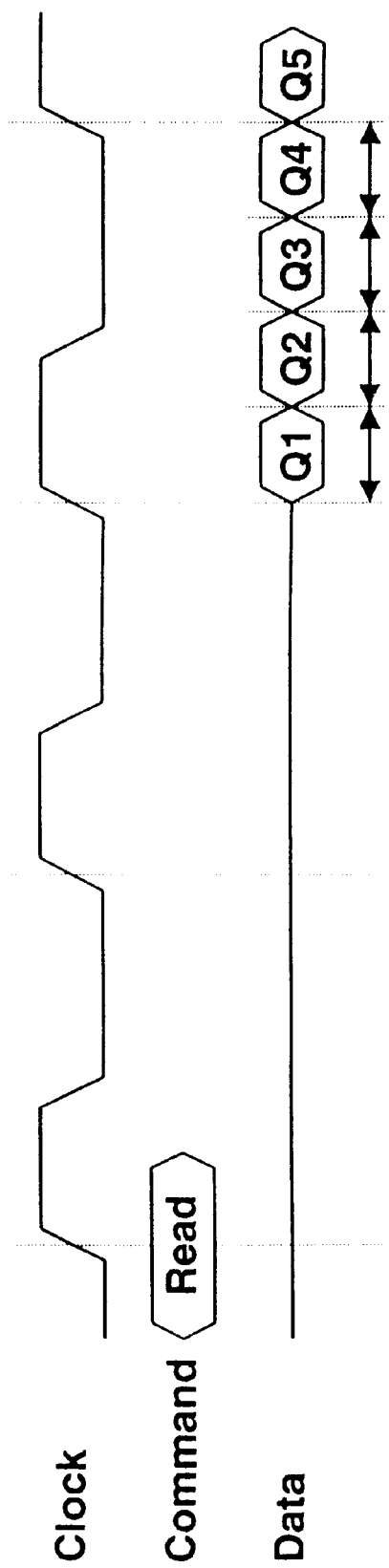
FIG. 15 is a timing chart showing an operation for outputting data continuously for four clocks.

The pulse signal 105 generated from the pulse generating circuit 113 has a phase of 0° for the external clock signal 1, the pulse signal 205 generated from the pulse generating circuit 213 has a phase of 90° for the external clock signal 1, the pulse signal 305 generated from the pulse generating circuit 313 has a phase of 180° for the external clock signal 1, and the pulse signal 405 generated from the pulse generating circuit 413 has a phase of 270° for the external clock signal 1. These pulse signals are multiplexed by the multiplexer 13 and the pulse signals output from the other delay circuit strings 22 and 23 are also multiplexed by the multiplexer for outputting as the internal signal 4. Thereby, the pulse signal, which satisfies the specification for the external clock signal 1 shown in FIG. 15, is obtained.

As explained above, all delay circuit strings 212, 312, and 412 has the same propagation delay ratio of 4:1, and the delay circuit strings 212, 312, and 412 commonly includes the delay circuit 211. Accordingly, in order to obtain the data from the data output terminal 5 at the timing shown in FIG. 3, it is only necessary to set the propagation delay ratios to the same values and to adjust the delay times of the delay circuits 111 and 112, which results in facilitating setting and measurement. In addition, since the delay time of the delay circuits is determined by the overhead t3 and since it is not necessary to provide a dummy circuit for matching the delay times of the receiving circuit 11 and the output circuit, the circuit scale can be small. In the delay circuit strings 212, 312, and 412, since each propagation time toward the left direction can be set more freely, the operating frequency of these delay circuit strings 212, 312, and 412 can be set to a sufficiently high frequency and the maximum operating frequency can be improved without restricting the performance of the integrated circuit.

As shown above, the first embodiment of the present invention was explained, but this invention is not limited to the above embodiment, but variants thereof can be envisaged without passing beyond the scope of the embodiment. For example, an example is shown, in which four pulses are generated within one clock period, but the present invention can be applied for generating two, three, five, and more pulses. It is possible to generate two pulses in one clock period by providing one delay circuit string having a propagation delay ratio of 2:1 to that of the delay circuit string 112.

In the above described first embodiment, the necessary pulse signals are obtained by providing three delay circuit strings 212, 312, and 412, each having the propagation delay ratio of 4:1, and by providing delay circuit strings 22 and 23 as well. This structure is, as shown in FIG. 3, constituted in order to output the pulse signal in the third cycle, after measuring the time in the first cycle after the external clock signal is input, and waiting for the time in the second cycle. However, it is possible to construct the structure by omitting the delay circuit strings 314, 414 in the delay circuit string 23 for removing the second cycle.

SECOND EMBODIMENT

The semiconductor integrated circuit according to the second embodiment of the present invention is described hereinafter in detail with reference to the attached drawings.

Figure 4:
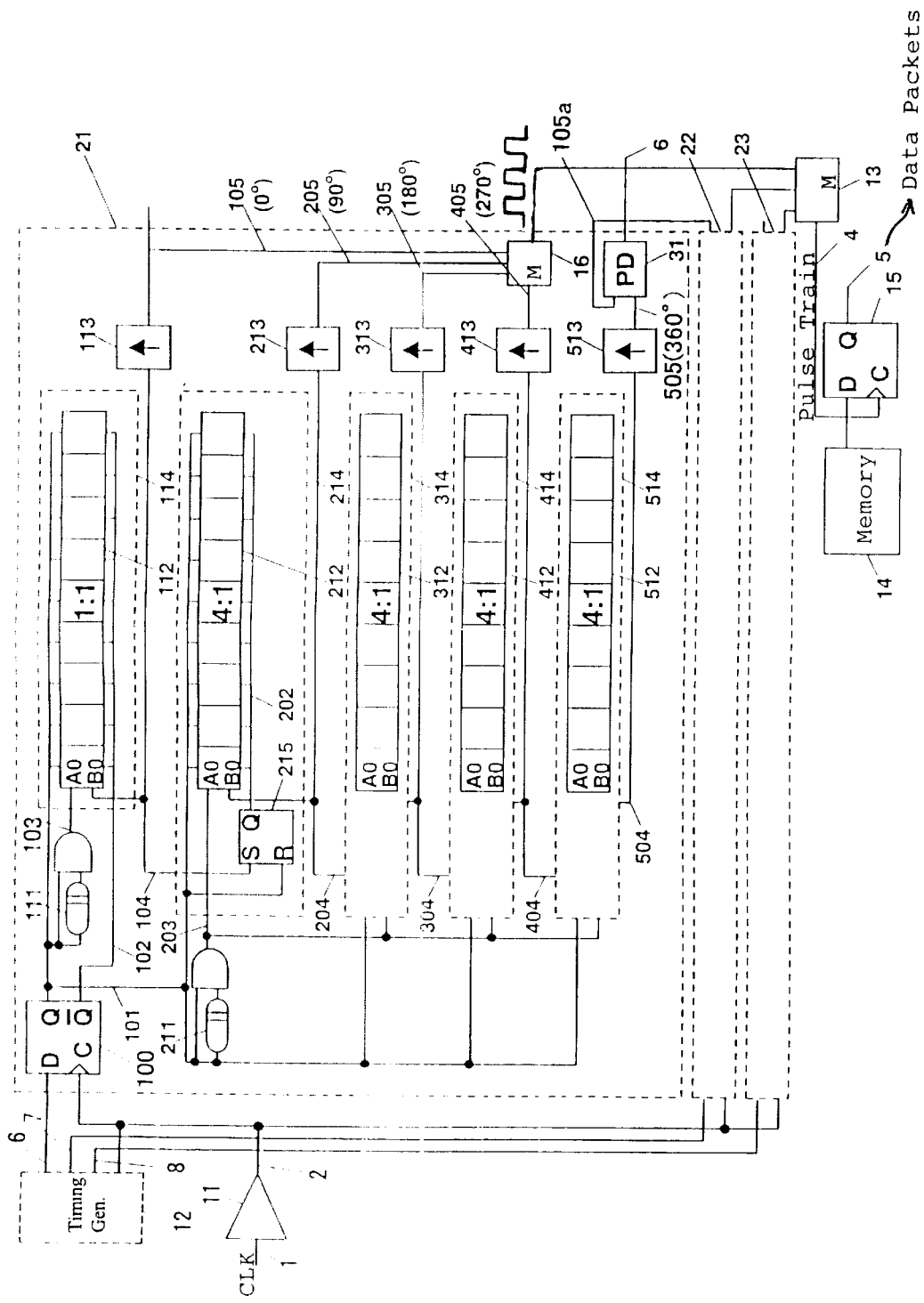
FIG. 4 is a block diagram showing a structure of a semiconductor integrated circuit according to the second embodiment of the present invention.

FIG. 4 is a block diagram showing the structure of the semiconductor integrated circuit according to the second embodiment of the present invention, and the same blocks of the semiconductor integrated circuit as those shown in FIG. 1 are denoted by the same reference numerals.

The semiconductor integrated circuit according to the second embodiment differs from that according to the first embodiment in that it comprises a delay circuit 514 having the same structure as those of delay circuits 214, 314, and a phase difference detecting device for detecting a phase difference between the delay circuit string output signal 504 and the pulse signal output from the delay circuit string 22 having the phase difference of 0° for the external clock signal 1.

The first control signal 101 and the control signal 203, output from the AND circuit, are input into the delay circuit 514, similar to the delay circuits 214, 314, and 414. The delay circuit string output signal 404 output from the delay circuit 414 are input into the S input end of the SR flip-flop. The delay circuit string output signal 504 is a signal having a phase being delayed at 360° for the delay circuit string output signal 104. The delay circuit string output signal 504 output from the delay circuit string 504 is connected to the pulse generating circuit 513, and the output of the pulse generating circuit 513 is connected to one input end of the phase difference detecting device 31.

The pulse signal having the phase difference of 0° for the external clock signal 1 is input to another input end of the phase detecting device 31 from the delay circuit string 22 which has the same structure as that of the delay circuit string 21. The reason for inputting the pulse signal output from the delay circuit string 22 into the phase difference detecting device 31 is that the use of the pulse signal from the delay circuit string 22 facilitates the circuit design for detecting the phase difference because the delay circuit string output signal 504 is delayed by 360° for the delay circuit string output signal 104 and the pulse signal being output from the delay circuit string 22 is also delayed by 360° for the delay circuit string output signal 104. It is also possible to design the circuit for detecting the phase difference between the pulse signal 105 in the delay circuit string 21 and the pulse signal 505. The phase difference detecting device 31 detects phase differences of the pulse signals being input from respective input ends and outputs a binary signal which indicates whether delay circuit string output signal 504 is advanced or delayed with respect to the delay circuit string output signal 104.

Next, the operation of the semiconductor integrated circuit according to the second embodiment will be described hereinafter.

Figure 5:
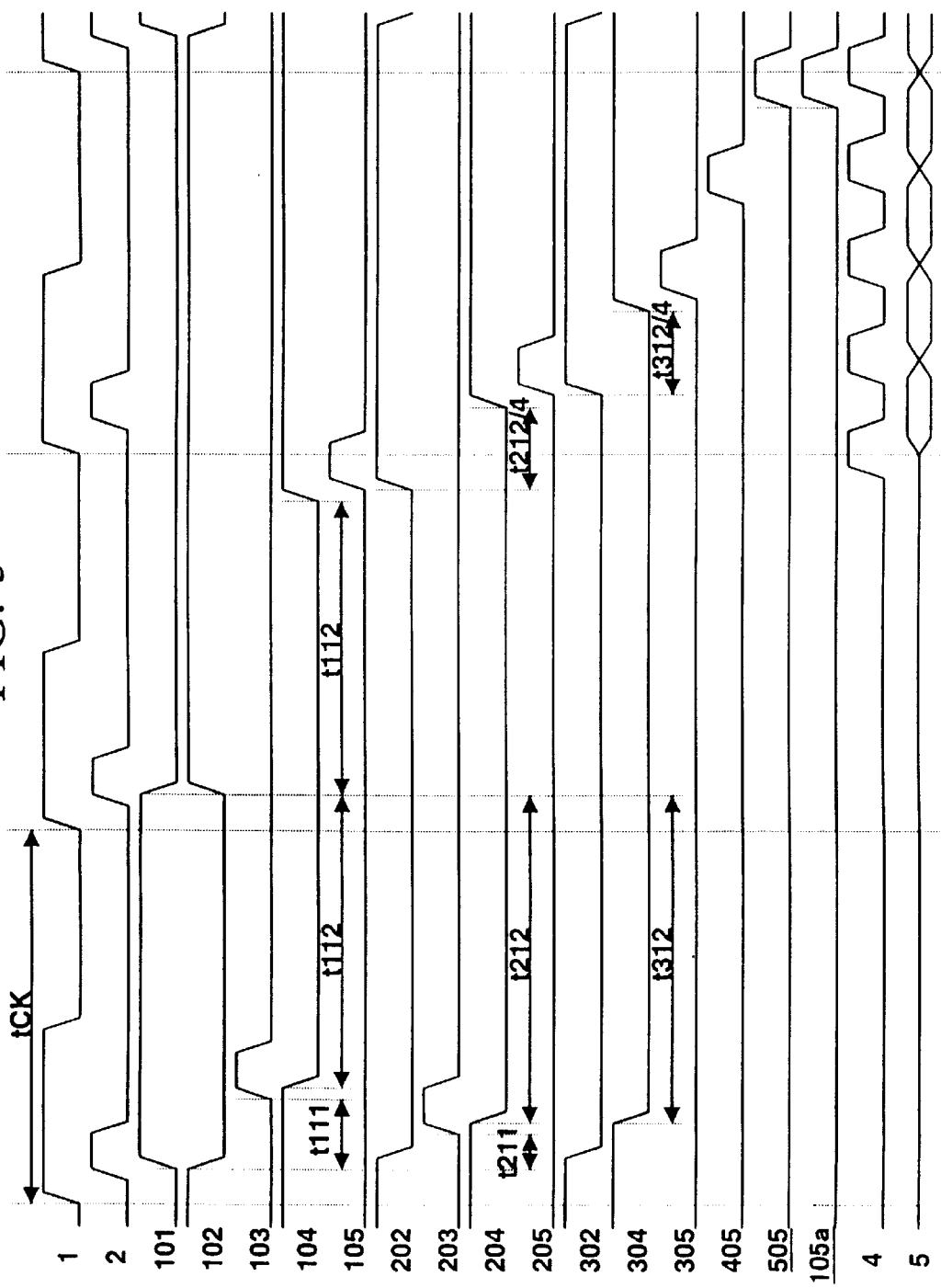
FIG. 5 is a timing chart showing an operation of the semiconductor integrated circuit according to the second embodiment of the present invention.

FIG. 5 is a timing chart showing the operation of the semiconductor integrated circuit according to the second embodiment of the present invention.

When an external clock 1 is input, the receiving circuit 11 rises, detects the edge, and outputs an internal signal 2 having a predetermined width. The internal clock signal 2 is input into timing generating circuit 12 and 100 and control signals 101 and 102 are output. In the first period in which the first control signal 101 is at the high potential and the second control signal is at the low potential, a control signal 103 is output from an AND circuit after passing a time t111 required for propagating in the delay circuit 111, and a control signal 203 is output from an AND circuit after passing a time t211 required for propagating in the delay circuit 211.

When these control signals 101 and 102 are output, edge signals propagate in the delay circuits 112, 212, 312, 412, and 512 towards the right direction in the figure. When the next external clock signal is input, the internal signal 2 is output from the receiving circuit 101 for inputting into the D flip-flop 100. Since the first control signal output from the D flip-flop is at the low potential and the second control signal 102 output from the D flip-flop is at the high potential, in the delay circuit string 112, in which the first and the second control signals are input, the edge signal, which is propagating towards the right direction, starts to propagate in the delay circuit string 112 toward the left direction at a time when the first control signal 101 is inverted to the low potential and the second control signal 102 is inverted to the high potential.

In the delay circuit strings 212, 312, 412, and 512, since the delay circuit string output signal is maintained at the low potential, the second control signal 102 is not changed to the high potential even if the first control signal 101 is inverted to the low potential. Thus, the edge signal, propagating toward the right direction of the figure in the delay circuit strings 212, 312, 412, and 512, stops propagation, without propagating toward the right or left directions.

When the time t111 has passed after the first control signal 101 is inverted to the low potential and the second control signal 102 is inverted to the high potential, the edge signal, propagating in the delay circuit string 112 toward the left direction of the figure, reaches the contact point B0, and the contact point B0 is inverted to the high potential. As a result, the delay circuit string output signal 104 is changed to the high potential.

When the delay circuit string output signal 104 becomes high potential, the pulse signal 105 is generated from the pulse generating circuit 113 at a timing shown in FIG. 5.

Moreover, when the delay circuit string output signal 104 is inverted to the high potential, the output Q of the SR flip-flop in the delay circuit 312 is inverted to the high potential, so that the edged signal in the standstill state starts propagating in the delay circuit string 212 toward the left direction of the figure, because the first control signal 101 is at the low potential. Since the propagation delay ratio of the delay circuit string 212 is set to 4:1, the time required to reach the contact point B0 is a quarter of the time t212 required for the edge signal propagating toward the right direction of the figure. Thus, when a quarter of the time t212 has passed after the delay circuit string output signal 104 has changed to the high potential, the delay circuit string output signal 204 is inverted to the high potential. When the delay circuit string output signal 204 is changed to the high potential, the pulse signal 205 is output from the pulse generating circuit 213 at a timing shown in FIG. 5.

Furthermore, when the delay circuit string output signal 204 is changed to the high potential, the output Q of the SR flip-flop in the delay circuit 312 is inverted to the high potential so that the edged signal in the standstill state starts propagating in the delay circuit string 312 toward the left direction of the figure because the first control signal 101 is at the low potential. Since the propagation delay ratio of the delay circuit string 312 is set to 4:1, the time required to reach the contact point B0 is a quarter of the time t312 required for the edge signal propagating toward the right direction of the figure. Thus, when a quarter of the time t312 passes after the delay circuit string output signal 204 has changed to the high potential, the delay circuit string output signal 304 is inverted to the high potential. When the delay circuit string output signal 304 is changed to the high potential, the pulse signal 305 is output from the pulse generating circuit 313 at a timing shown in FIG. 5.

Similarly, when the delay circuit string output signal 304 is changed to the high potential, the output Q of the SR flip-flop in the delay circuit 412 is inverted to the high potential, so that the edged signal in the standstill state starts propagating in the delay circuit string 412 toward the left direction of the figure because the first control signal 101 is at the low potential. Since the propagation delay ratio of the delay circuit string 412 is set to 4:1, the time required to reach the contact point B0 is a quarter of the time t412 required for the edge signal propagating toward the right direction of the figure. Thus, when a quarter of the time t412 has passed after the delay circuit string output signal 304 has changed to the high potential, the delay circuit string output signal 404 is inverted to the high potential. When the delay circuit string output signal 404 is changed to the high potential, the pulse signal 405 is output from the pulse generating circuit 413 at a timing shown in FIG. 5.

Furthermore, when the delay circuit string output signal 404 is changed to the high potential, the output Q of the SR flip-flop in the delay circuit 512 is inverted to the high potential, so that the edged signal in the standstill state starts propagating in the delay circuit string 512 toward the left direction of the figure because the first control signal 101 is at the low potential. Since the propagation delay ratio of the delay circuit string 512 is set to 4:1, the time required to reach the contact point B0 is a quarter of the time t312 required for the edge signal propagating toward the right direction of the figure. Thus, when a quarter of the time t512 has passed after the delay circuit string output signal 404 has changed to the high potential, the delay circuit string output signal 504 is inverted to the high potential. When the delay circuit string output signal 504 is changed to the high potential, the pulse signal 505 is output from the pulse generating circuit 513 at a timing shown in FIG. 5.

In addition, a pulse signal 105a is output from the delay circuit string 22 as shown in FIG. 5, and the phase difference between the pulse signal 505 and the pulse signal 105a is detected. In an example shown in FIG. 5, although the phase difference between the pulse signal 505 and the pulse signal 105a is zero, a signal indicating a phase difference value is output from the phase difference detecting device 31, if there is a certain phase difference.

As a results of the above described operations, the phase difference of the pulse signal 105 output by the pulse generating circuit 113 is 0° with respect to the external clock signal 1, the phase difference of the pulse signal 205 output by the pulse generating circuit 213 is 90° with respect to the external clock signal 1, the phase difference of the pulse signal 305 output by the pulse generating circuit 313 is 180° with respect to the external clock signal 1, and the phase difference of the pulse signal 405 output by the pulse generating circuit 413 is 270° with respect to the external clock signal 1. These pulse signals are multiplexed by the multiplexer 16 and these pulse signals are also multiplexed by the multiplexer 13 with other pulse signals output from the other delay circuit strings 22 and 23 to be output as an internal signal. Thereby, similar to the first embodiment, a pulse signal, which satisfies the specification shown in FIG. 15 for the external clock signal, is obtained.

As described above, the present embodiment, similar to the first embodiment, comprises delay circuit strings 212, 312, and 412, each having the same propagation delay ratio of 4:1, and these delay circuit strings 212, 312, and 412 commonly share the delay circuit 211. Accordingly, in order to obtain the data from the data output terminal 5 at the timing shown in FIG. 5, it is only necessary to set the propagation delay ratios for the delay circuit strings 212, 312, and 412 to the same values and to adjust the delay times of the delay circuits 111 and 112, which results in facilitating setting and measurement. In addition, since the delay time of the delay circuits is determined by the overhead t3 and since it is not necessary to provide the dummy circuit for matching the delay times of the receiving circuit 11 and the output circuit, the circuit scale can be small. In the delay circuit strings 212, 312, and 412, since each propagation time toward the left direction can be set more freely, the operating frequency of these delay circuit strings 212, 312, and 412 can be set to a sufficiently high frequency and the maximum operating frequency can be improved without restricting the performance of the integrated circuit.

In the second embodiment, the phase difference between the pulse signal 505 and the pulse signal 105*a* is detected by the phase difference detecting device 31. The detection of the phase difference between the pulse signal 505 and the pulse signal 105*a* allows adjustments at the wafer stage of the delay times of the delay circuits 111 and 211 as well as the delay time ratios of the delay circuit strings 112, 212, 312, and 412, if a phase difference is detected. In general, although high accuracy tests at the wafer stage are not possible, the phase comparison between internal signals is an advantageous and effective test in that it can be executed accurately.

As shown above, the second embodiment of the present invention is explained. This invention is not limited to the above embodiment, but variants thereof can be envisaged without passing beyond the scope of the embodiment. For example, an example is shown in which four pulses are generated within one clock period, but the present invention can be applied to the cases of generating two pulses, three pulses, and more than five pulses.

In the above described second embodiment, it is possible to operate the integrated circuit without using the second cycle by removing the delay circuit strings 314 and 414 in the delay circuit string 23.

THIRD EMBODIMENT

A semiconductor integrated circuit according to the third embodiment of the present invention will be described hereinafter with reference to attached drawings.

Figure 6:
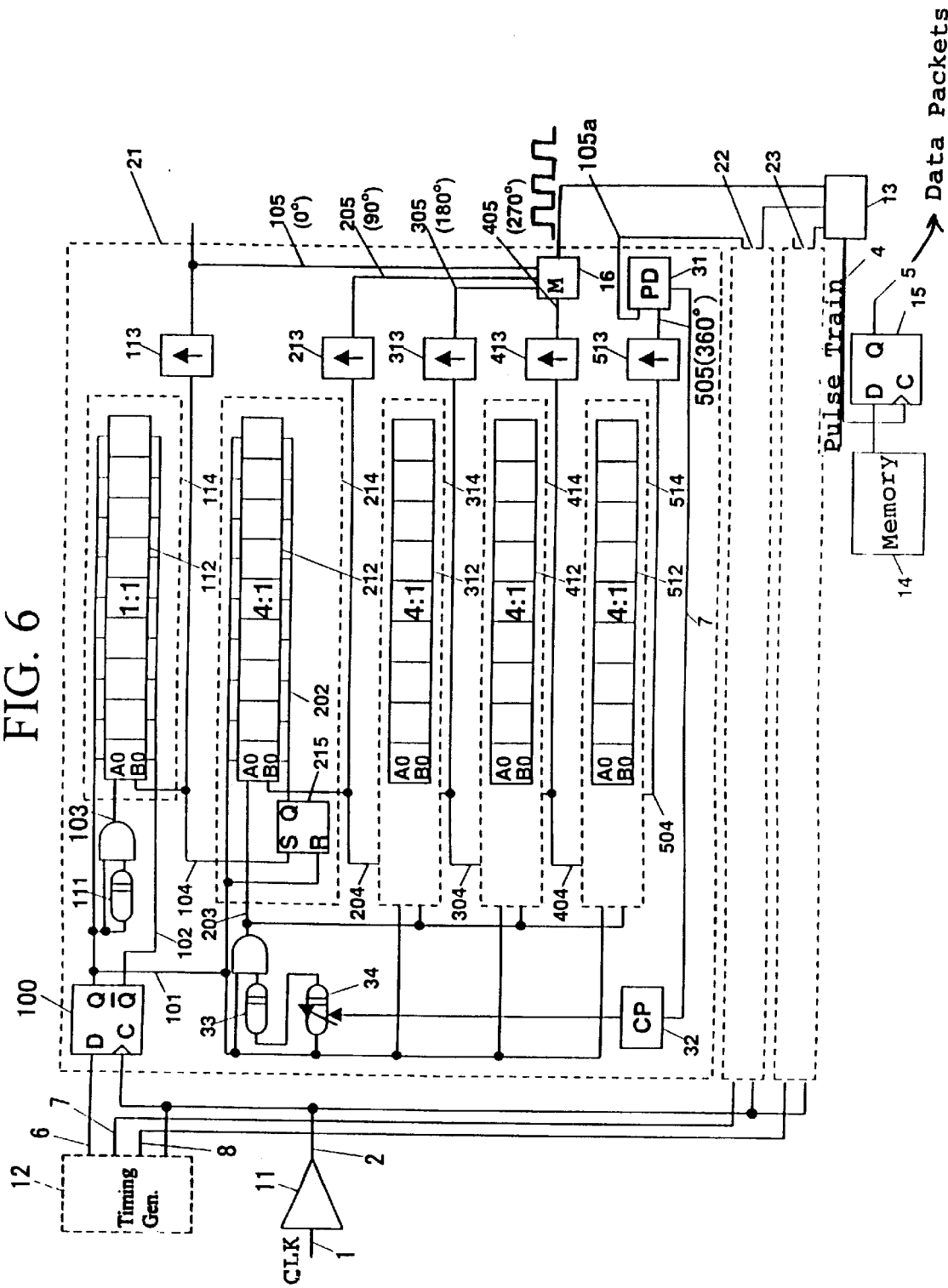
FIG. 6 is a block diagram showing a structure of a semiconductor integrated circuit according to the third embodiment of the present invention.

FIG. 6 is a block diagram showing a structure of a semiconductor integrated circuit according to the third embodiment of the present invention, and the same blocks as those in the semiconductor integrated circuit according to the second embodiment of the present invention shown in FIG. 4 are denoted by the same numerals.

The semiconductor integrated circuit according to the third embodiment differs from that according to the second embodiment in that the third embodiment comprising a combination of a delay circuit 33 having a fixed delay time and a delay circuit 34 having variable delay time, in place of the delay circuit 211 in FIG. 4, and a charge pump 32 for outputting a voltage signal or a current signal based on the output signal from the phase difference detecting device 31, wherein the delay time of the delay circuit 34 is controlled based on the voltage signal or the current signal output from the charge pump 32.

Next, the operation of the semiconductor integrated circuit according to the third embodiment is described.

Figure 7:
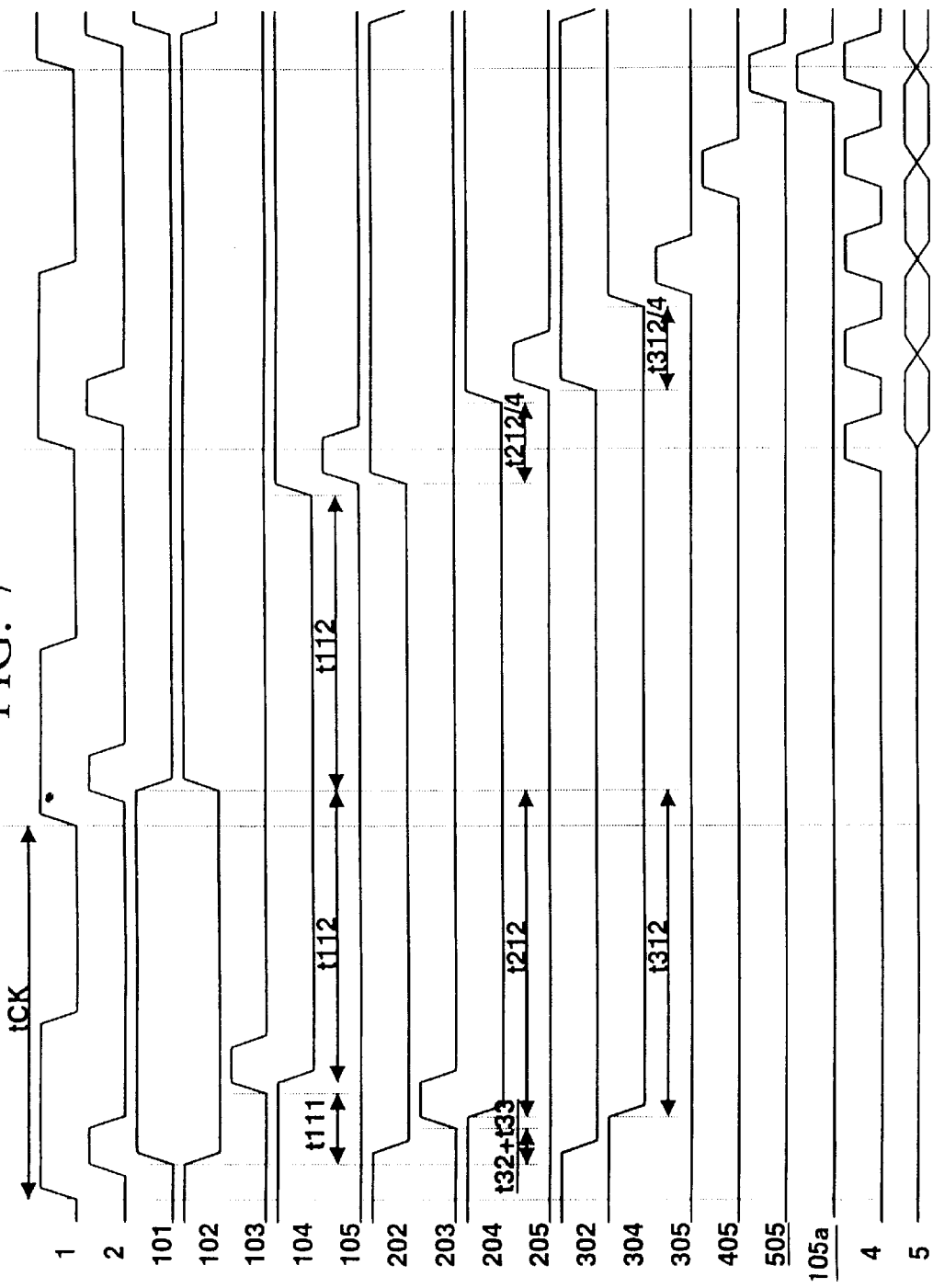
FIG. 7 is a timing chart showing an operation of the semiconductor integrated circuit according to the third embodiment of the present invention.
Figure 10A:
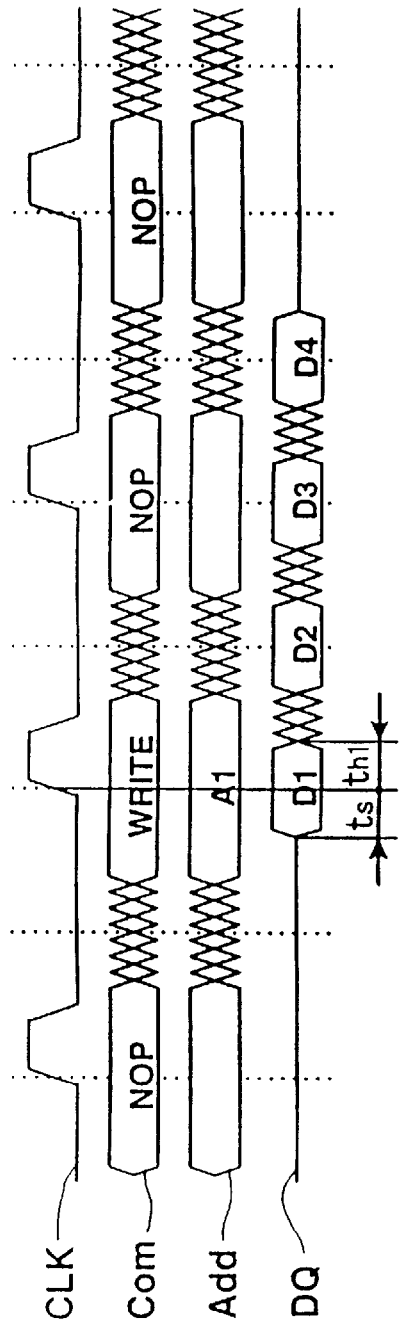
FIGS. 10A and 10B are timing charts in the case of performing a double data rate operation.
Figure 10B:
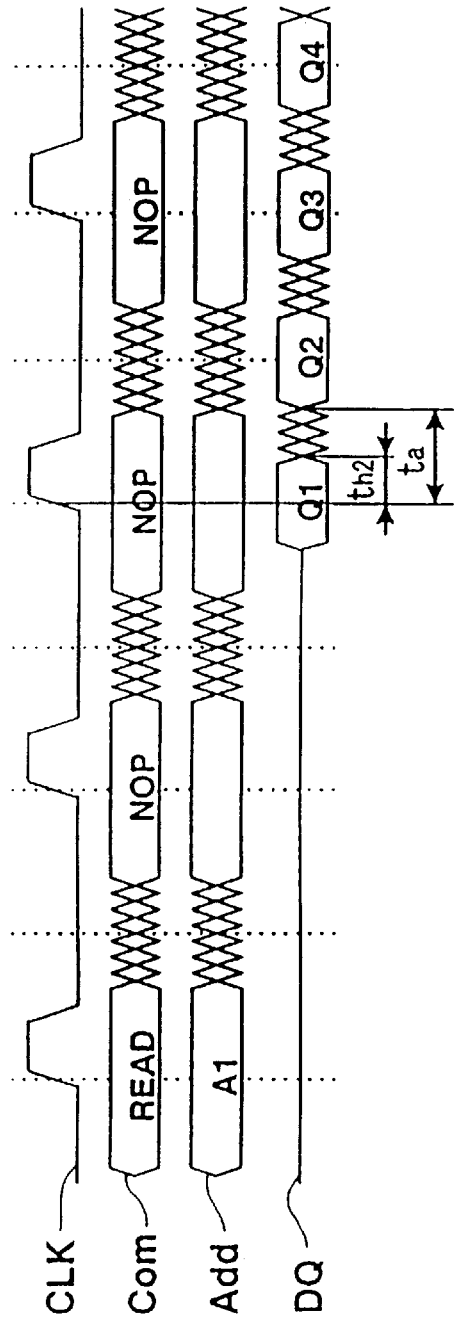
Figure 11:
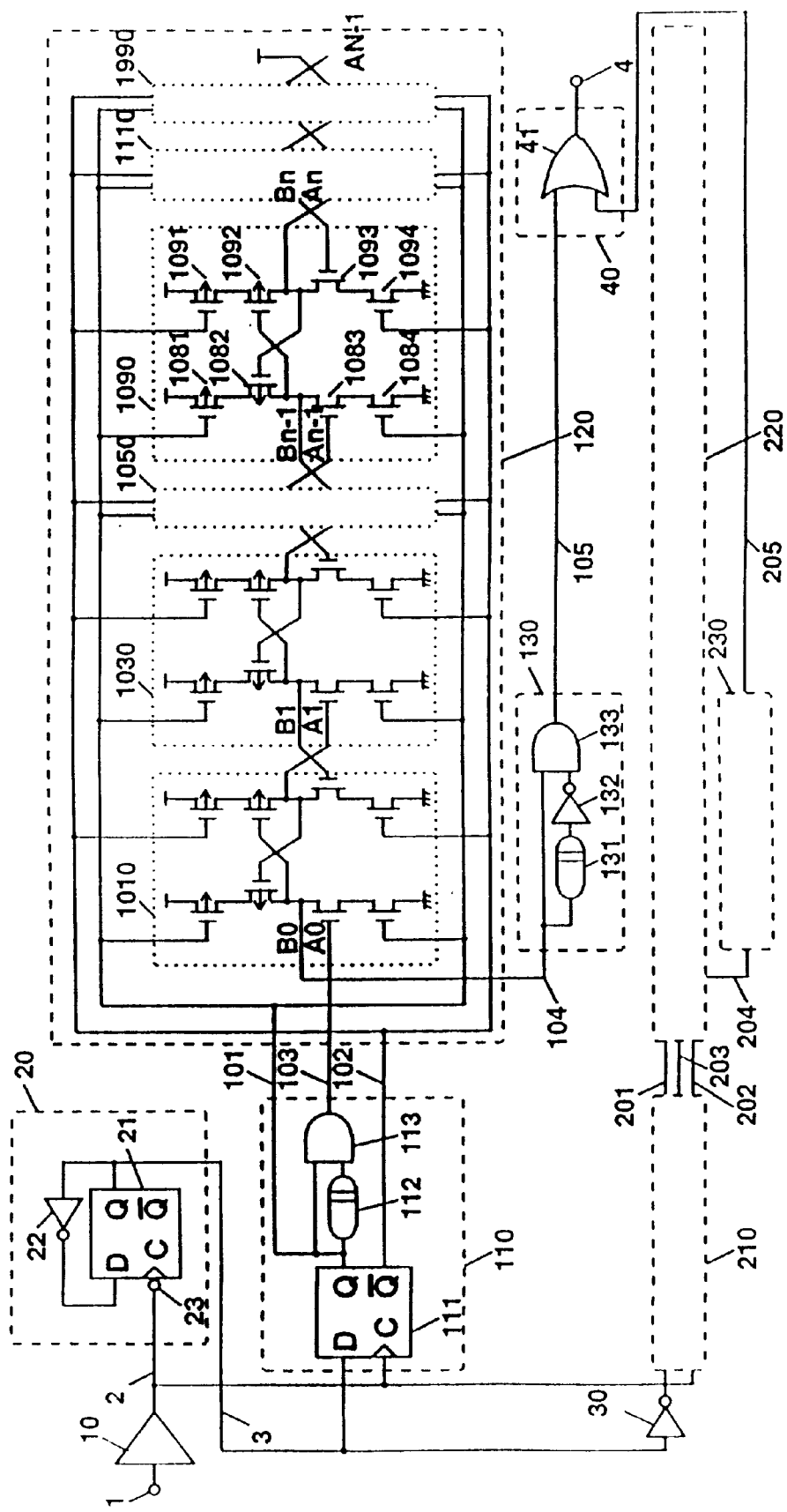
FIG. 11 is a circuit diagram showing the basic circuit structure by which the problems of RDLL and SMD are solved.
Figure 12:
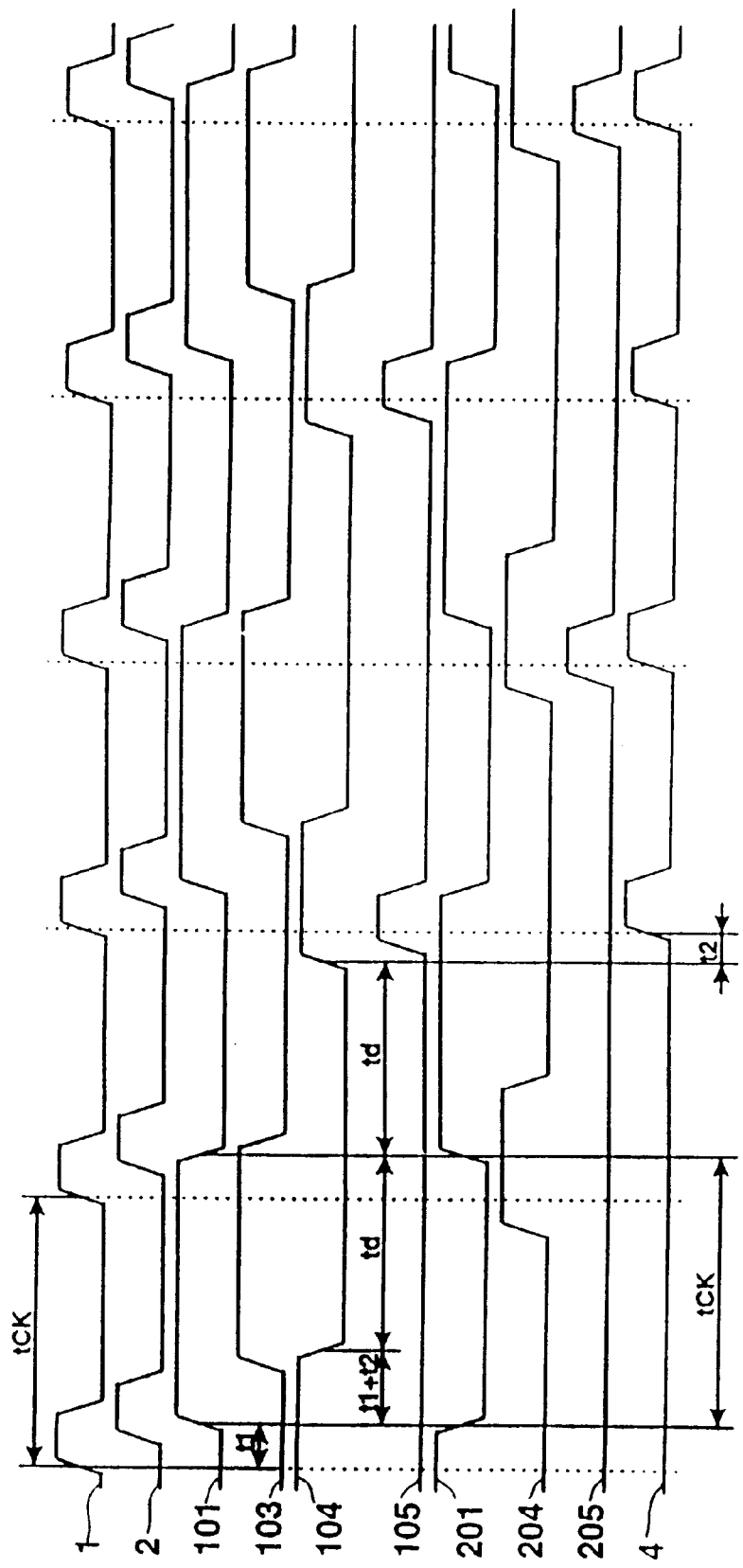
FIG. 12 is a timing chart for explaining the overall operation of the conventional circuit.
Figure 13:
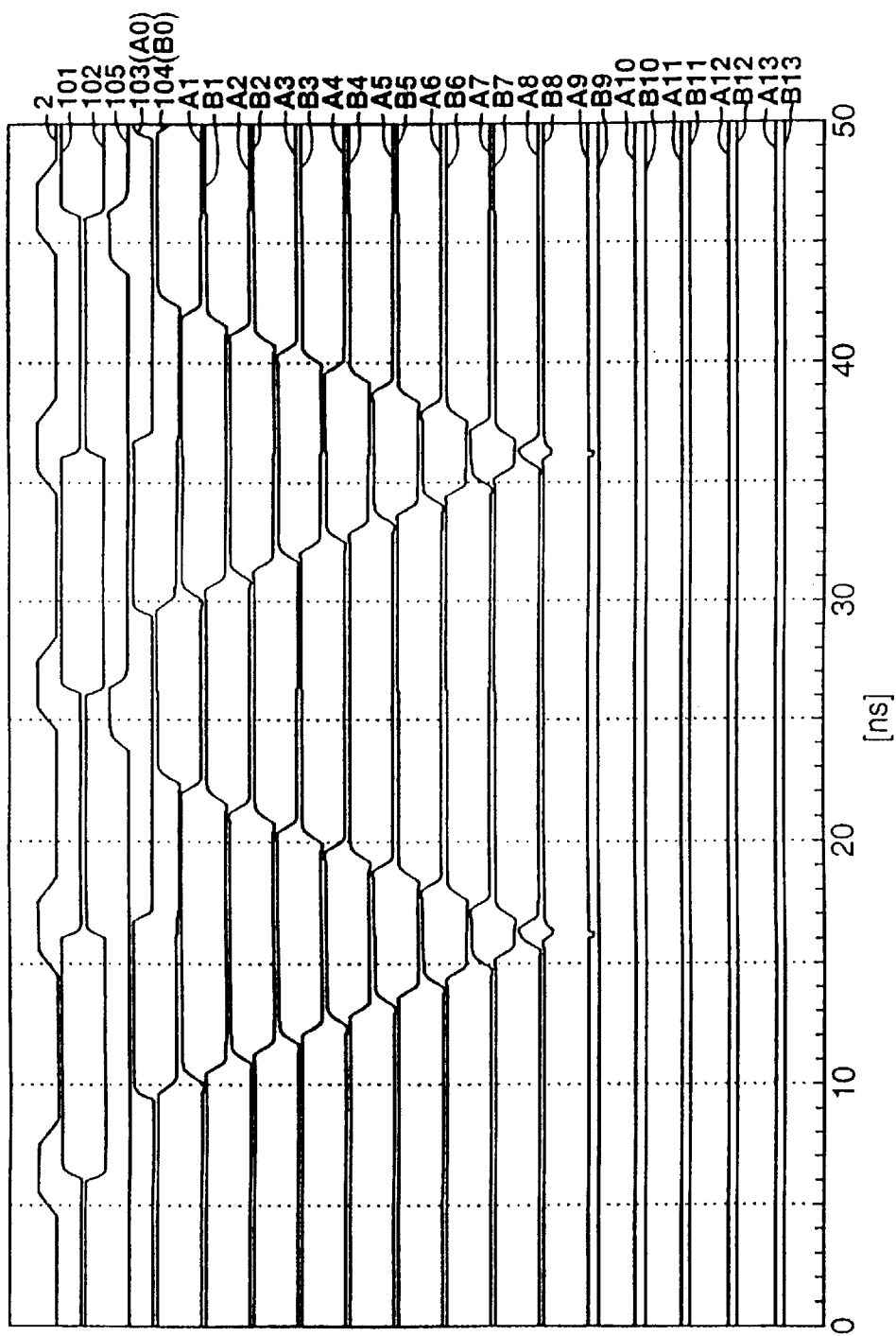
FIG. 13 is a timing chart for explaining operations of the control circuit 110, the delay circuit string 120, and the pulse generating circuit 130.
Figure 14:
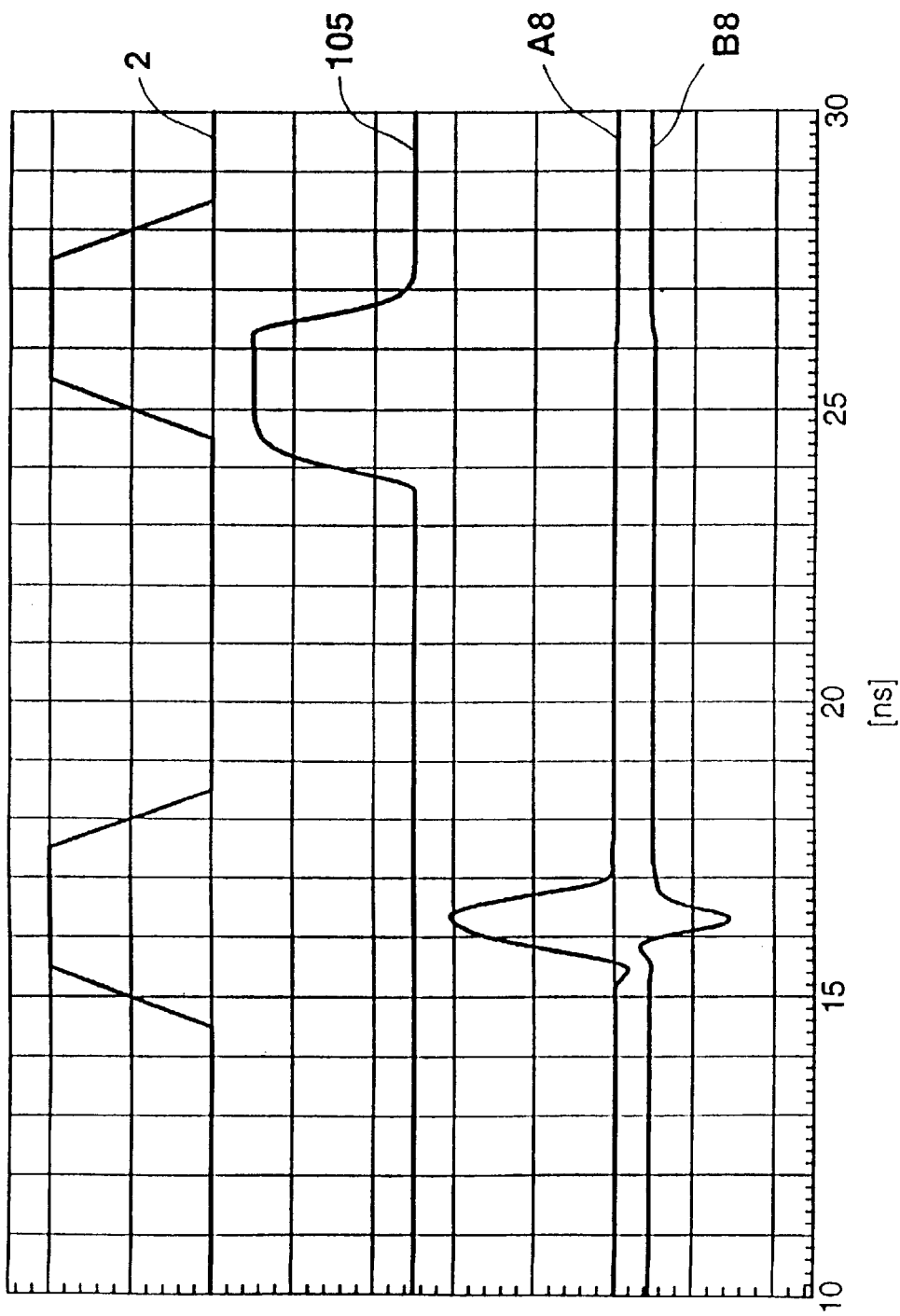
FIG. 14 is a timing chart for explaining the delay time of the delay circuit string 120 when the clock cycle varies slightly.

FIG. 7 is a timing chart showing the operation of the semiconductor integrated circuit according to the third embodiment of the present invention.

When the external clock 1 is input, the receiving circuit 11 is activated for detecting the edge and outputs an internal signal 2 constituted by a pulse having a predetermined pulse width. The internal clock signal is input into the timing generating circuits 12 and 100, which output the control signals 101 and 102. In the first period, in which the first control signal 101 is at the high potential, and the second control signal 102 is at the low potential, and the control signal 102 is at the low potential, a control signal 103 is output from the AND circuit after the time t111 required for propagating in the delay circuit 111 has passed, and a control signal 203 is output from the AND circuit after the time t32+t33 required for propagating through the delay circuit 111 has passed.

When these control signals 103 and 203 are output, the edge signals propagate in respective delay circuits 112, 212, 312, 412, and 512 toward the right direction of the figure. When the next external clock 1 is input, an internal signal 2 is output from the receiving circuit 101 and input into the D flip-flop. The first control signal 101 output from the D flip-flop is inverted to the low potential and the second control signal 102 is inverted to the high potential. In the delay circuit string 112 in which both first and second control signals 101 and 102 are input, the edge signal, propagating toward the right direction, starts propagating toward the left direction at the timing when the first control signal 101 is inverted to the low potential and the second control signal is inverted to the high potential.

In the delay circuit strings 212, 312, 412, and 512, since the delay circuit string output signal 104 is at the low potential, the second control signal 202 is not inverted to the high potential even if the first control signal 101 is inverted to the low potential. Thus, the edge signal, propagating in the delay circuit strings 212, 312, 412, and 512 in the right direction of the figure, stops propagation toward right or toward left directions.

When the time t112 passes after the first control signal is inverted to the low potential and the second signal is inverted to the high potential, the edge signal propagating through the delay circuit string 112 toward the left direction reaches the contact point B0, and the contact point B0 is inverted to the high potential. As a result, the delay circuit string output signal 104 is inverted to the high potential.

When the delay circuit string output signal 104 is inverted to the high potential, a pulse signal 105 is generated from the pulse signal generating circuit 113 at a timing shown in FIG. 7.

Moreover, when the delay circuit string output signal 104 is inverted to the high potential, the output Q of the SR flip-flop in the delay circuit 312 is inverted to the high potential, so that the edged signal in the standstill state starts propagating through the delay circuit string 212 toward the left direction of the figure, because the first control signal 101 is at the low potential. Since the propagation delay ratio of the delay circuit string 212 is set to 4:1, the time required to reach the contact point B0 is a quarter of the time t212 required for the edge signal propagating toward the right direction of the figure. Thus, when a quarter of the time t212 has passed after the delay circuit string output signal 104 has changed to the high potential, the delay circuit string output signal 204 is inverted to the high potential. When the delay circuit string output signal 204 is changed to the high potential, the pulse signal 205 is output from the pulse generating circuit 213 at a timing shown in FIG. 7.

Furthermore, when the delay circuit string output signal 204 is changed to the high potential, the output Q of the SR flip-flop (not shown) in the delay circuit 312 is inverted to the high potential so that the edged signal in the standstill state starts propagating in the delay circuit string 312 toward the left direction of the figure because the first control signal 101 is at the low potential. Since the propagation delay ratio of the delay circuit string 312 is set to 4:1, the time required for reaching the contact point B0 is a quarter of the time t312 required for the edge signal propagating toward the right direction of the figure. Thus, when a quarter of the time t312 has passed after the delay circuit string output signal 204 has changed to the high potential, the delay circuit string output signal 304 is inverted to the high potential. When the delay circuit string output signal 304 has changed to the high potential, the pulse signal 305 is output from the pulse generating circuit 313 at a timing shown in FIG. 7.

Similarly, when the delay circuit string output signal 304 is changed to the high potential, the output Q of the SR flip-flop (not shown) in the delay circuit 412 is inverted to the high potential so that the edged signal in the standstill state starts propagating through the delay circuit string 412 toward the left direction of the figure because the first control signal 101 is at the low potential. Since the propagation delay ratio of the delay circuit string 412 is set to 4:1, the time required to reach the contact point B0 is a quarter of the time t412 required for the edge signal propagating toward the right direction of the figure. Thus, when a quarter of the time t412 has passed after the delay circuit string output signal 304 has changed to the high potential, the delay circuit string output signal 404 is inverted to the high potential. When the delay circuit string output signal 404 is changed to the high potential, the pulse signal 405 is output from the pulse generating circuit 413 at a timing shown in FIG. 7.

Furthermore, when the delay circuit string output signal 404 is changed to the high potential, the output Q of the SR flip-flop (not shown) in the delay circuit 512 is inverted to the high potential, so that the edged signal in the standstill state starts propagating in the delay circuit string 512 toward the left direction of the figure, because the first control signal 101 is at the low potential. Since the propagation delay ratio of the delay circuit string 512 is set to 4:1, the time required to reach the contact point B0 is a quarter of the time t312 required for the edge signal propagating toward the right direction of the figure. Thus, when a quarter of the time t512 has passed after the delay circuit string output signal 404 has changed to the high potential, the delay circuit string output signal 504 is inverted to the high potential. When the delay circuit string output signal 504 has changed to the high potential, the pulse signal 505 is output from the pulse generating circuit 513 at a timing shown in FIG. 7.

In addition, a pulse signal 105a is output from the delay circuit string 22 as shown in FIG. 5, and the phase difference between the pulse signal 505 and the pulse signal 105a is detected. In an example shown in FIG. 5, although the phase difference between the pulse signal 505 and the pulse signal 105a is zero, a signal indicating a phase difference value is output from the phase difference detecting device 31, if there is a certain phase difference.

As a results of the above described operations, the phase difference of the pulse signal 105 output by the pulse generating circuit 113 is 0° with respect to the external clock signal 1, the phase difference of the pulse signal 205 output by the pulse generating circuit 213 is 90° with respect to the external clock signal 1, the phase difference of the pulse signal 305 output by the pulse generating circuit 313 is 180° with respect to the external clock signal 1, and the phase difference of the pulse signal 405 output by the pulse generating circuit 413 is 270° with respect to the external clock signal 1. These pulse signals are multiplexed by the multiplexer 16 and these pulse signals are also multiplexed by the multiplexer 13 with other pulse signals output from the other delay circuit strings 22 and 23 for output as an internal signal. Thereby, similar to the first embodiment, a pulse signal, which satisfies the specification shown in FIG. 15 for the external clock signal, is obtained. The third embodiment may be considered to be an integrated circuit, in which the delay circuit for rough adjustment of the DLL is substituted by the synchronous clock generating circuit. Although a feature that the integrated circuit can be stabilized by two cycles of the external signal 1 is lost, the present embodiment allows rapid stabilization of the DLL circuit and eliminates the danger of malfunction.

As described above, the present embodiment, similar to the first embodiment, comprises delay circuit strings 212, 312, and 412, each having the same propagation delay ratio of 4:1, and these delay circuit strings 212, 312, and 412 commonly share the delay circuit 211. Accordingly, in order to obtain the data from the data output terminal 5 at the timing shown in FIG. 7, it is only necessary to set the propagation delay ratios for the delay circuit strings 212, 312, and 412 to the same values and to adjust the delay times of the delay circuits 111 and 112, which results in facilitating setting and measurement. In addition, since the delay time of the delay circuits is determined by the overhead t3 and since it is not necessary to provide the dummy circuit for matching the delay time of the receiving circuit 11 and the output circuit, the circuit scale can be small. In the delay circuit strings 212, 312, and 412, since each propagation time toward the left direction can be set more freely, the operating frequency of these delay circuit strings 212, 312, and 412 can be set to a sufficiently high frequency and the maximum operating frequency can be improved without restricting the performance of the integrated circuit.

In the present embodiment, as shown in FIG. 7, the pulse signal 105a is generated from the delay circuit string 22 and the phase difference between the pulse signal 505 and the pulse signal 105a is detected. In the example shown in FIG. 7, although the phase difference is zero, the signal may be output indicating the phase difference if there is a certain phase difference from the phase difference detecting device 31.

As shown above, the third embodiment of the present invention is explained. This invention is not limited to the above embodiment, but variants thereof can be envisaged without passing beyond the scope of the embodiment. For example, an example is shown, in which four pulses are generated within one clock period, but the present invention can be applied to the cases of generating two pulses, three pulses, and more than five pulses.

In the above described third embodiment, it is possible to operate the integrated circuit without using the second cycle by removing the delay circuit strings 314 and 414 in the delay circuit string 23.

As explained above, the present invention has the favorable effect that the circuit may be easily formed and measurement and settings may be executed easily, since the present integrated circuit comprises the second delay circuit strings, in which propagation times in upstream and downstream paths are the same, and the second delay circuit shared commonly by these delay circuit strings.

In addition, since the phase difference of pulse signals are detected by the phase difference detecting circuit based on the signals output from the first delay circuit string and the third delay circuit string, the present invention has the effect that the measurement and setting of the semiconductor circuit as produced can be easily executed.

In addition, since the delay times in the second delay circuit string can be varied, and since the delay time is controlled based on the phase difference detected by the above described phase difference detecting device, the present invention exhibits the effect that the stable operation can be realized even when the delay time fluctuates due to, for example, the temperature change.

What is claimed is:

1. A semiconductor integrated circuit which generates a plurality of pulse signals in synchronism with an external clock signal and having at least one module, said module comprising:
   a control signal outputting circuit for outputting a control signal in synchronism with said external clock signal;
   a first delay circuit for outputting a first delayed control signal, which comprises a delayed signal of said control signal for a first predetermined time;
   a first delay circuit string, in which propagation times for propagating in a forward path and a backward path are set to a same time and in which a time for switching the propagation path from said forward path to said backward path is controlled by said control signal, for making an edge signal propagate reciprocatively when said first delay control signal is input;
   a second delay circuit for outputting a second delay control signal responsive to said control signal, which comprises a delayed signal of said control signal for a second predetermined time;
   a second delay circuit string, coupled to said backward path of said first delay circuit string, in which a ratio of a propagation time in a forward path to a propagation time in a backward path is set to a predetermined value, in which an edge signal is made to propagate in said forward path when said second delay control signal is input and in which a timing to switch a propagation path of said edge signal from said forward path to said backward path is controlled by an output signal output after reciprocatively propagating in said first delay circuit string; and
   a pulse generating circuit for generating a pulse signal from signals output from said first and second delay circuit strings.

2. A semiconductor integrated circuit according to claim 1, said at least one module further comprising:
   a third delay circuit string and a fourth delay circuit string, each provided in parallel with said second delay circuit and having a same propagation delay time ratio as that of said second delay circuit string and in which a timing for said third delay circuit string to switch a propagation path from forward to backward is controlled by an output signal from said second delay circuit string and a timing for said fourth delay circuit string to switch a propagation path from forward to backward is controlled by an output signal from said third delay circuit string;
   a pulse generating circuit for generating a pulse signal from a signal output from said third delay circuit string and said fourth delay circuit string; and
   a phase difference detecting circuit for detecting a phase difference between two pulse signals, one of which is generated by a signal output corresponding to said first delay circuit string and another one of which is generated by said signal output from said fourth delay circuit string.

3. A semiconductor integrated circuit according to claim 2, wherein said second predetermined time of said second delay circuit is variable, said module further comprising:
   a control circuit for controlling said variable delay time of said second delay circuit based on an output of said phase difference detecting circuit.

4. A semiconductor integrated circuit according to claim 1, wherein said predetermined value of said ratio of a propagation time in said forward path to a propagation time in said backward path of said second delay string is set to 4:1.

5. A semiconductor integrated circuit according to claim 1, said at least one module further comprising:
   a multiplexer for multiplexing pulse signals generated by said pulse generating circuit.

6. A semiconductor integrated circuit according to claim 1, wherein said first predetermined time in said first delay circuit is set to be a sum of a delay time of an input circuit, a delay time of an output circuit, and an overhead time.

7. A semiconductor integrated circuit according to claim 1, wherein said second predetermined time in said second delay circuit is set to be four times an overhead time.

8. A semiconductor integrated circuit according to claim 1, further comprising:
   a plurality of said modules in parallel; and
   a multiplexer for multiplexing outputs of said plurality of modules.

9. A semiconductor integrated circuit, which outputs a plurality of pulse signals in synchronism with an external clock signal, comprising:
   a control signal output circuit for outputting a control signal in synchronism with said external clock signal;
   a first delay circuit for outputting a first delayed control signal which comprises a delayed signal of said control signal for a first predetermined time;
   a first delay circuit string in which the propagation times for propagating in a forward path and a backward path is set to a same time and in which a timing for switching the propagation path from the forward path to the backward path is controlled by said control signal, said first delay circuit string making an edge signal propagate reciprocatively when said first delay control signal is input;
   a second delay circuit for outputting a second delay control signal responsive to said control signal, said second delay control signal thereby being a delayed signal of said control signal for a second predetermined time;
   a second delay circuit string comprising a plurality of delay circuit strings, each of said plurality of delay strings having a predetermined ratio of a propagation time in a forward path relative to a propagation time in a backward path, each of said plurality of delay strings propagating an edge signal in a forward path when said second delayed control signal is input and switching from said forward path to said backward path based on an output signal of an adjacent previous delay circuit string; and
   a pulse generating circuit for generating a pulse signal from signals output from each of said first and second delay circuit strings.

10. A semiconductor integrated circuit according to claim 9, further comprising:
    a third delay circuit string having a same propagation delay time ratio as that of said each of said plurality of delay strings in said second delay circuit string and in which switching from a forward path to a backward path is controlled by an output signal from said second delay circuit string;
    a pulse generating circuit for generating a pulse signal from a signal output from said third delay circuit string; and a phase difference detecting circuit for detecting a phase difference between a signal corresponding to said output pulse signal from said first delay circuit string and said output pulse signal from said third delay circuit string.

11. A semiconductor integrated circuit according to claim 10, wherein said second predetermined time of said second delay circuit is variable, said semiconductor integrated circuit further comprising:

a control circuit for controlling said variable delay time of said second delay circuit based on an output of said phase difference detecting circuit.

12. A semiconductor integrated circuit according to claim 9, wherein the ratio of the propagation time in the forward path to the propagation time in the backward path of each said delay circuit string comprising said second delay plurality circuit string is set to n:1 (n is a natural number).

13. A semiconductor integrated circuit according to claim 9, wherein the ratio of the propagation time in the forward path to the propagation time in the backward path of each said delay circuit string comprising said second delay plurality circuit string is set to 4:1.

14. A semiconductor integrated circuit according to claim 13, further comprising:

a multiplexer for multiplexing pulse signals generated by said pulse generating circuit.

15. A semiconductor integrated circuit according to claim 9, wherein said first predetermined delay time in said first delay circuit is set by a sum of a delay time of an input circuit, a delay time of an output circuit, and an overhead time.

16. A semiconductor integrated circuit according to claim 1, wherein said second predetermined delay time in said second delay circuit is set to n (n is a natural number) times an overhead time.

17. A semiconductor integrated circuit according to claim 1, wherein said second predetermined delay time in said second delay circuit is set to four times an overhead time.

18. A semiconductor integrated circuit according to claim 1, further comprising:

a plurality of said modules in parallel and a multiplexer for multiplexing outputs of said plurality of modules.

19. A circuit generating n pulses synchronized to an external clock signal received as an input signal, said circuit comprising:

a plurality of n delay circuit strings, each said delay circuit string having a forward propagation path and a backward propagation path, said delay circuit strings interconnected such that an $i^{th}$ delay circuit string receives as an input a backward propagation path output signal of an $(i-1)^{th}$ delay circuit string;

a first predetermined time delay controlling a first of said n delay circuit strings, said first time delay synchronized to said clock signal;

a second predetermined time delay controlling a remaining (n−1) of said n delay circuit strings, said second time delay synchronized to said clock signal; and a plurality of n pulse generators, each of said pulse generators respectively connected to a forward propagation path output signal of each said plurality of n delay circuit strings.

20. The circuit of claim 19, further comprising:

a multiplexer to provide an output signal comprising a multiplexed pulse train signal of said n pulse generators and said pulse train comprises pulses spaced approximately 1/n of a time period of said clock signal.

21. The circuit of claim 19, wherein a time ratio of said forward propagating path and said backward propagating path of said first delay circuit string is set to be 1:1 and said time ratio of said remaining (n−1) delay circuit strings is set to be n:1.

22. The circuit of claim 19, further comprising:

a deviation detector measuring a phase error of an output of said nth delay circuit string relative to said clock signal; and a controller changing a duration of said second predetermined time delay, based on an output signal from said deviation detector.

* * * * *